(12) United States Patent
Hozumi et al.

(10) Patent No.: US 8,395,230 B2
(45) Date of Patent: Mar. 12, 2013

(54) SEMICONDUCTOR DEVICE AND METHOD OF MANUFACTURING THE SAME

(75) Inventors: Hiroki Hozumi, Kanagawa (JP); Yuji Sasaki, Kanagawa (JP); Shusaku Yanagawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 337 days.

(21) Appl. No.: 12/498,674

(22) Filed: Jul. 7, 2009

(65) Prior Publication Data

US 2010/0032791 A1 Feb. 11, 2010

(30) Foreign Application Priority Data

Aug. 8, 2008 (JP) ................................. 2008-205325

(51) Int. Cl.
*H01L 29/66* (2006.01)
*H01L 21/20* (2006.01)
*H01L 21/768* (2006.01)
(52) U.S. Cl. ........... 257/493; 257/E29.166; 257/E21.09; 257/E21.589; 438/429
(58) Field of Classification Search .................. 257/493, 257/E29.166, E21.09, E21.589; 438/429
See application file for complete search history.

(56) References Cited

U.S. PATENT DOCUMENTS

| 7,598,586 B2 * | 10/2009 | Takaishi ...................... 257/492 |
| 2008/0315297 A1 * | 12/2008 | Takashita et al. ............. 257/328 |

FOREIGN PATENT DOCUMENTS

| JP | 09-283754 | 10/1997 |
| JP | 2002-280555 | 9/2002 |
| JP | 2004-006595 | 1/2004 |
| JP | 2004-356383 | 12/2004 |
| JP | 2006-005275 | 1/2006 |
| JP | 2007-012801 | 1/2007 |
| JP | 2007-096344 | 4/2007 |
| JP | 2007-173418 | 4/2007 |
| JP | 2007-116190 | 7/2007 |

* cited by examiner

*Primary Examiner* — Calvin Lee
*Assistant Examiner* — Monica D Harrison
(74) *Attorney, Agent, or Firm* — Robert J. Depke; The Chicago Technology Law Group, LLC.

(57) ABSTRACT

A semiconductor device includes: a first semiconductor region of a first conductivity type disposed on the side of a first electrode; and a second semiconductor region having first pillar regions of the first conductivity type and second pillar regions of a second conductivity type, the first pillar regions and the second pillar regions being provided in paired state and alternately, in a device portion and a terminal portion surrounding the device portion, along a surface on the side of a second electrode disposed on the opposite side of the first semiconductor region from the first electrode. The semiconductor device further includes a lateral RESURF (reduced surface field) region of the second conductivity type disposed at a surface portion, on the opposite side from the first semiconductor region, of the second semiconductor region in the terminal portion.

14 Claims, 16 Drawing Sheets

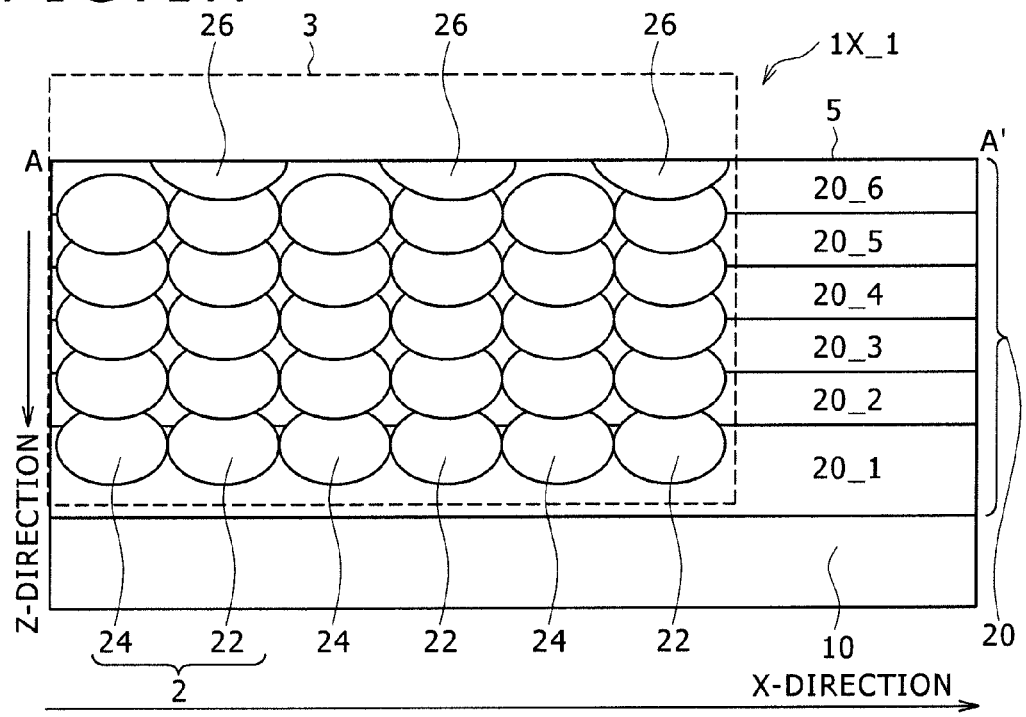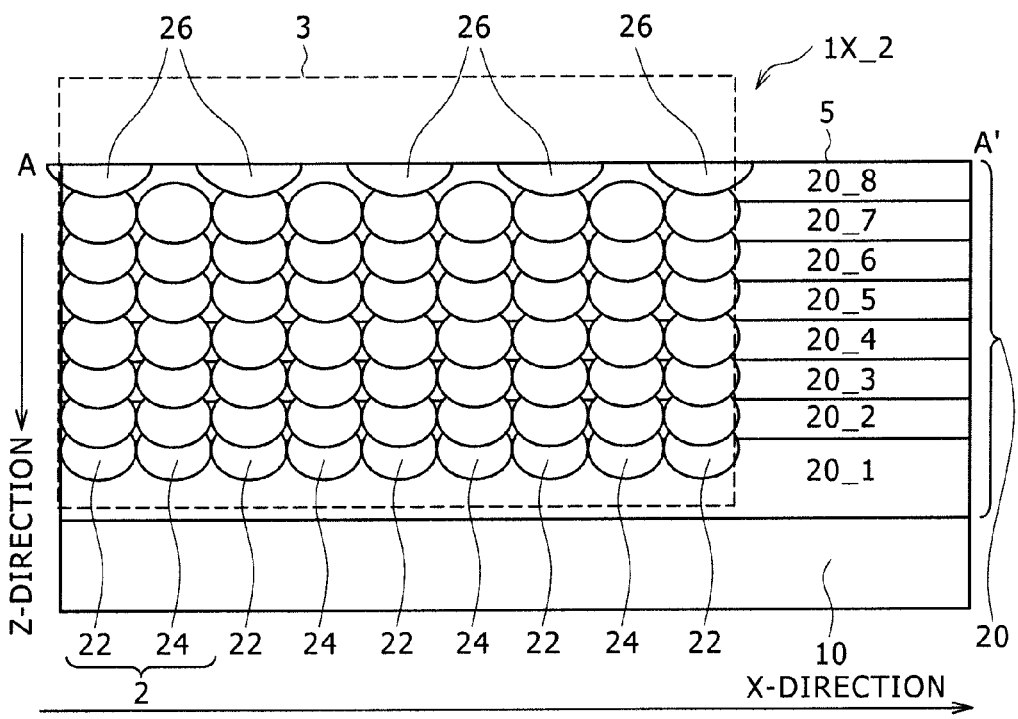

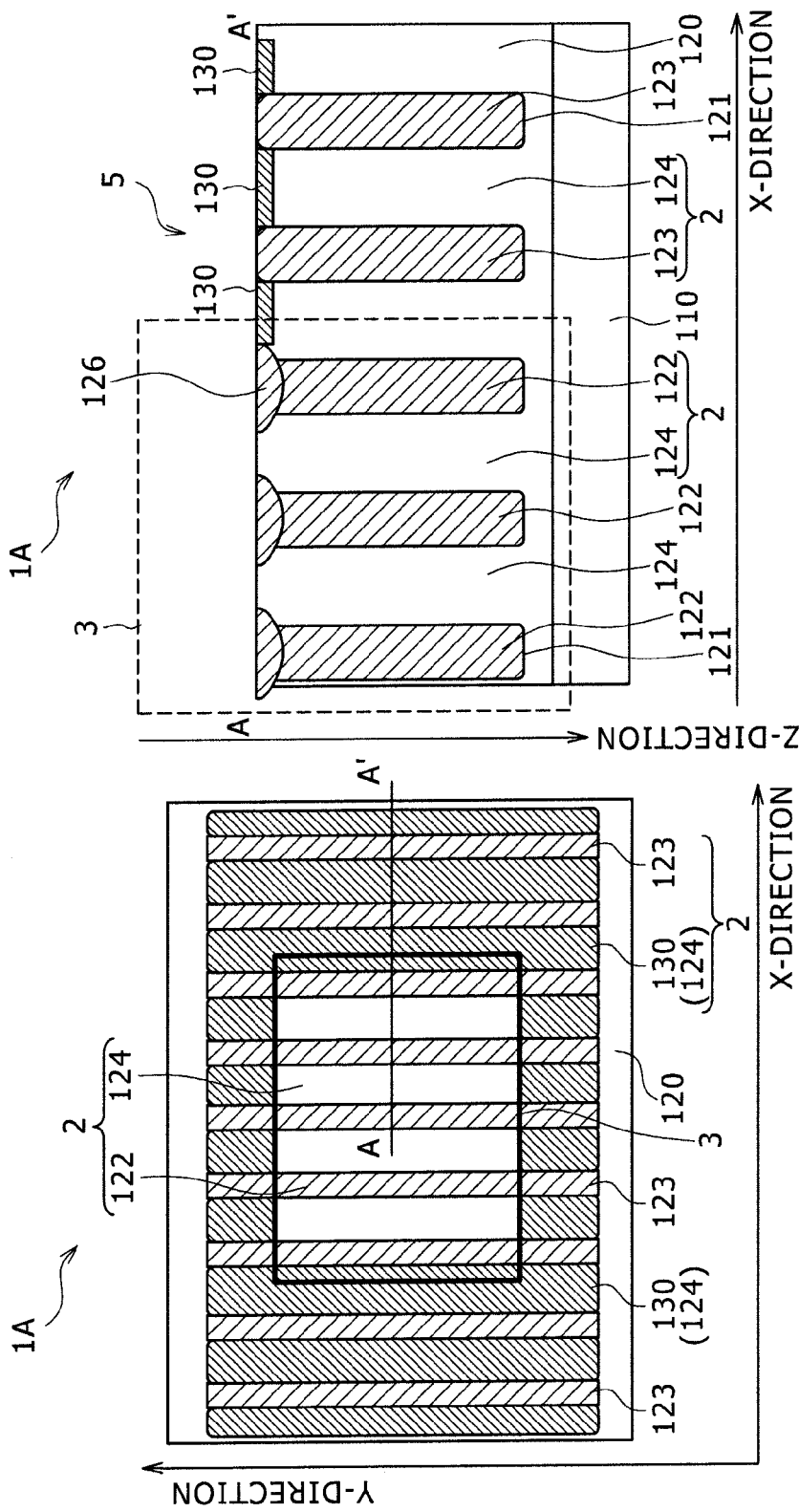

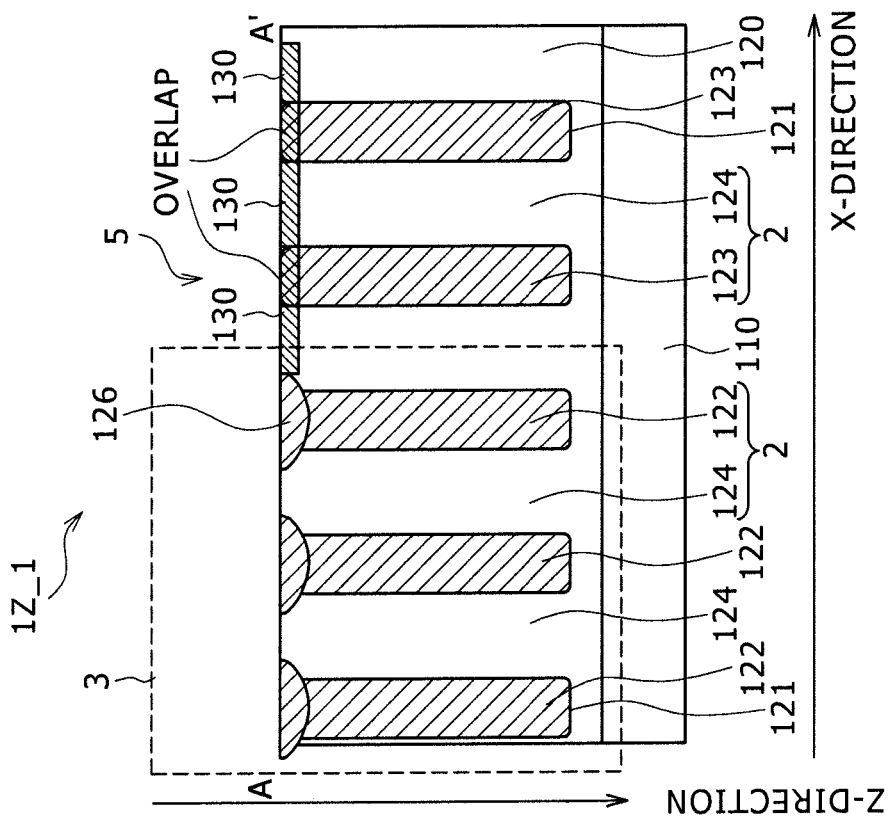
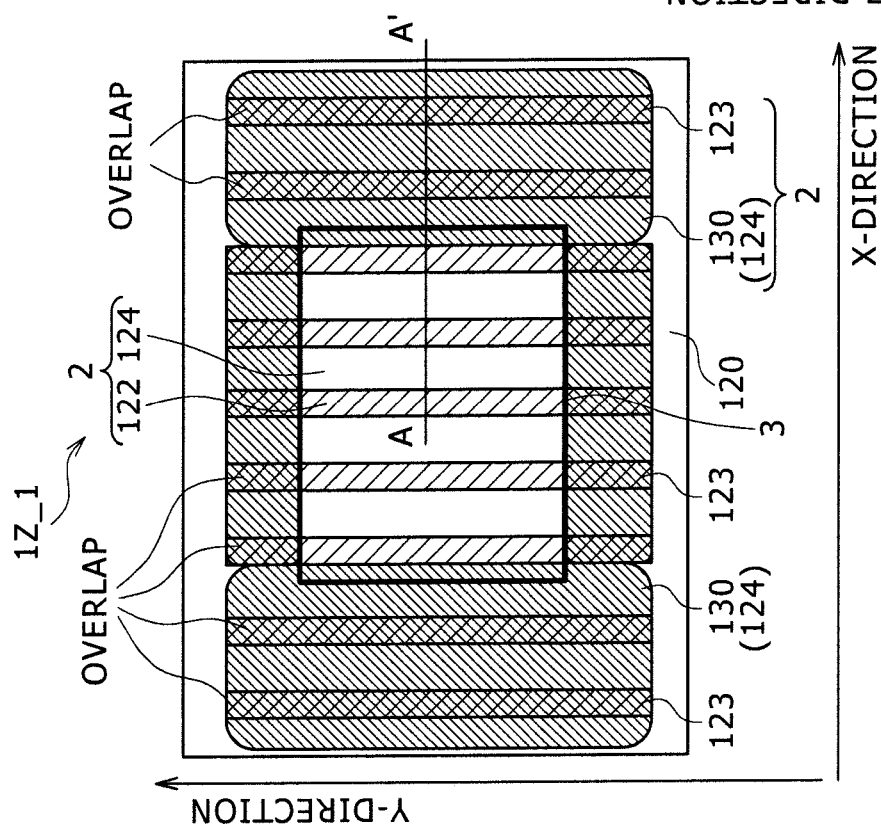

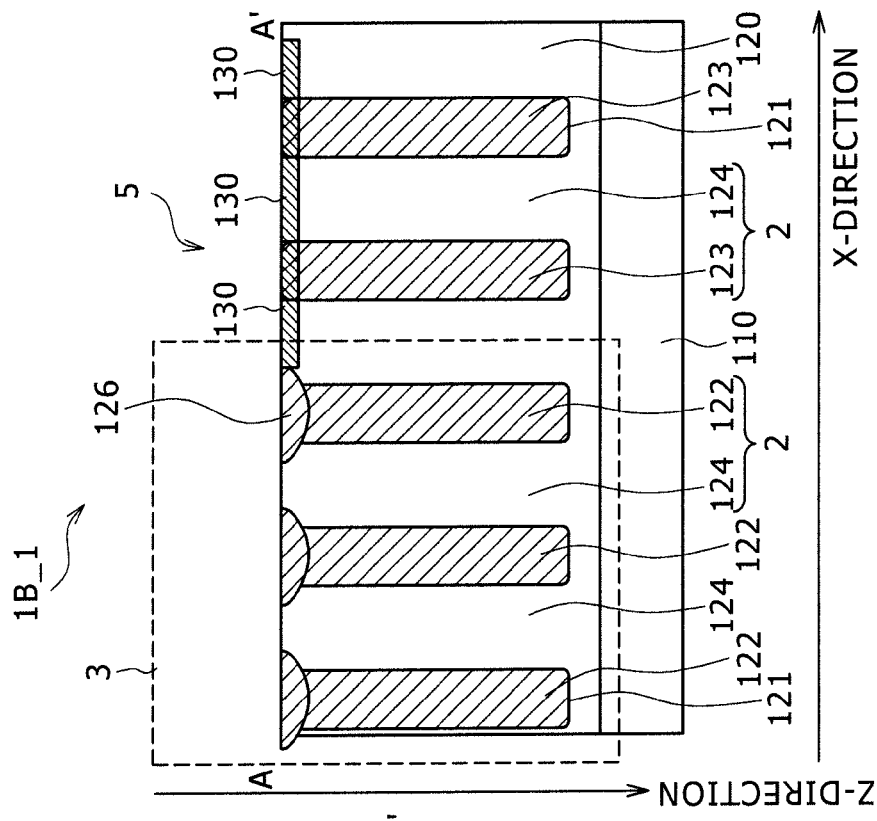
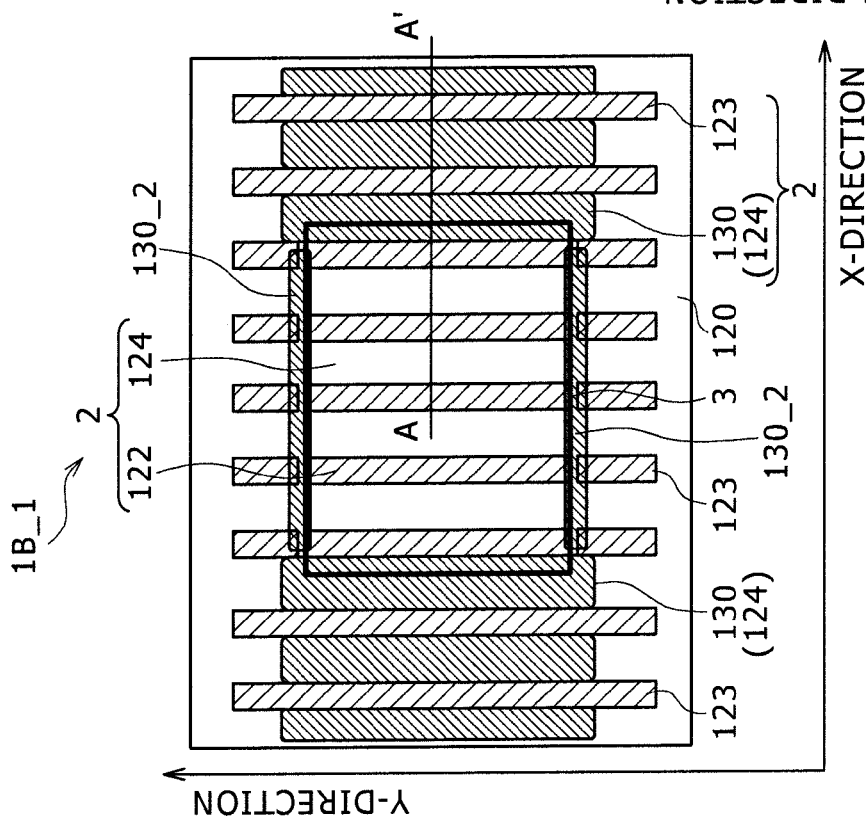

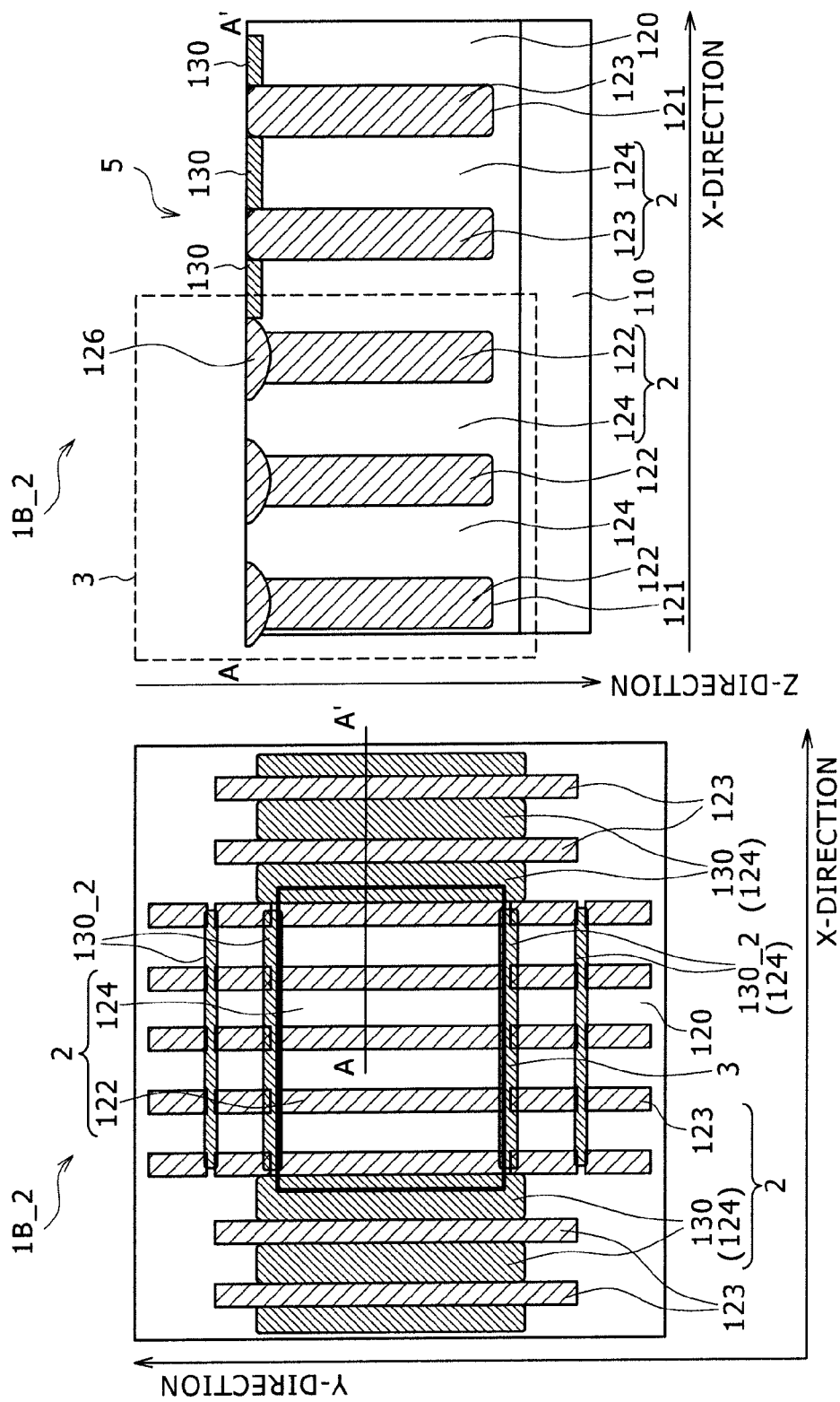

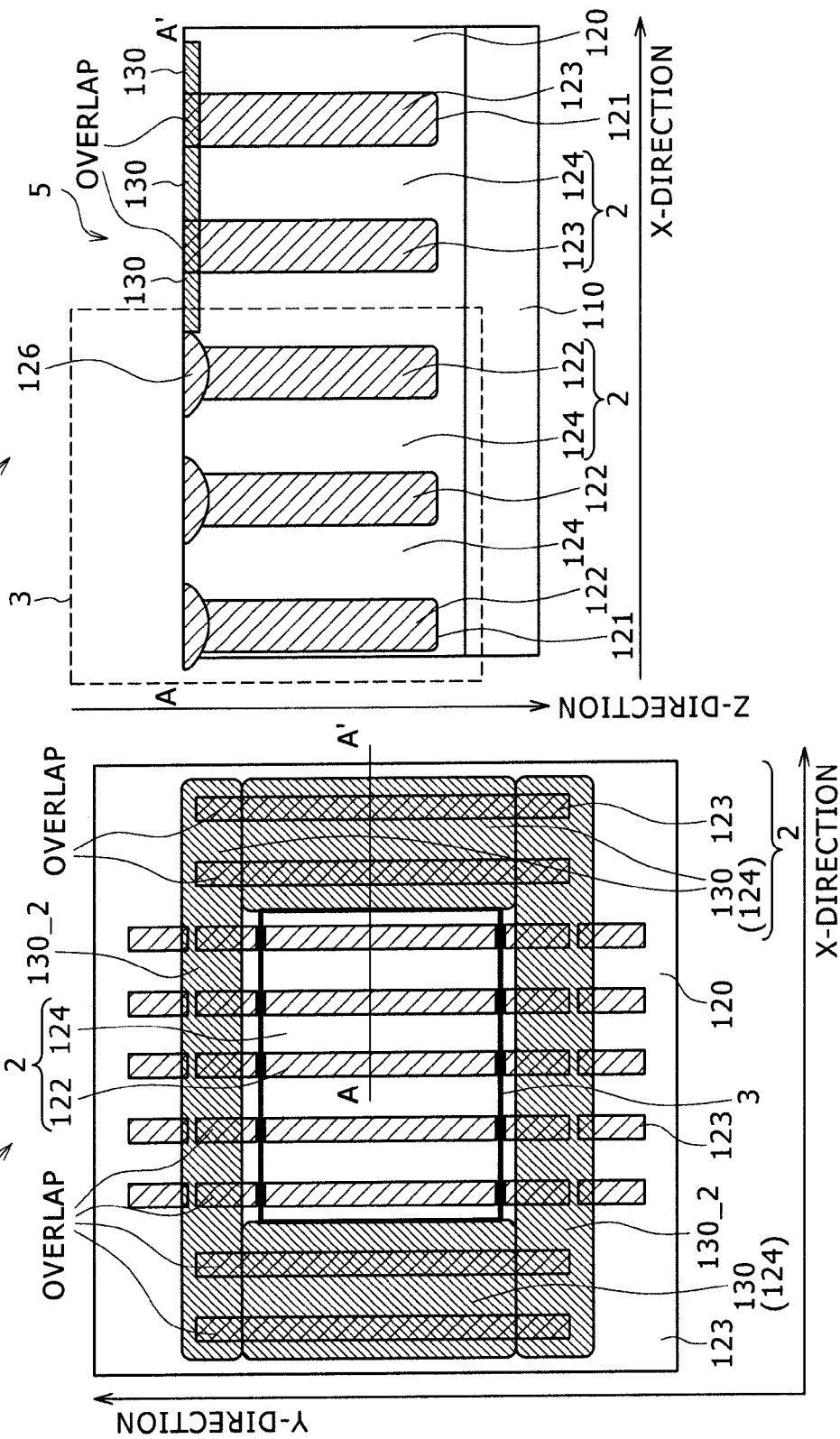

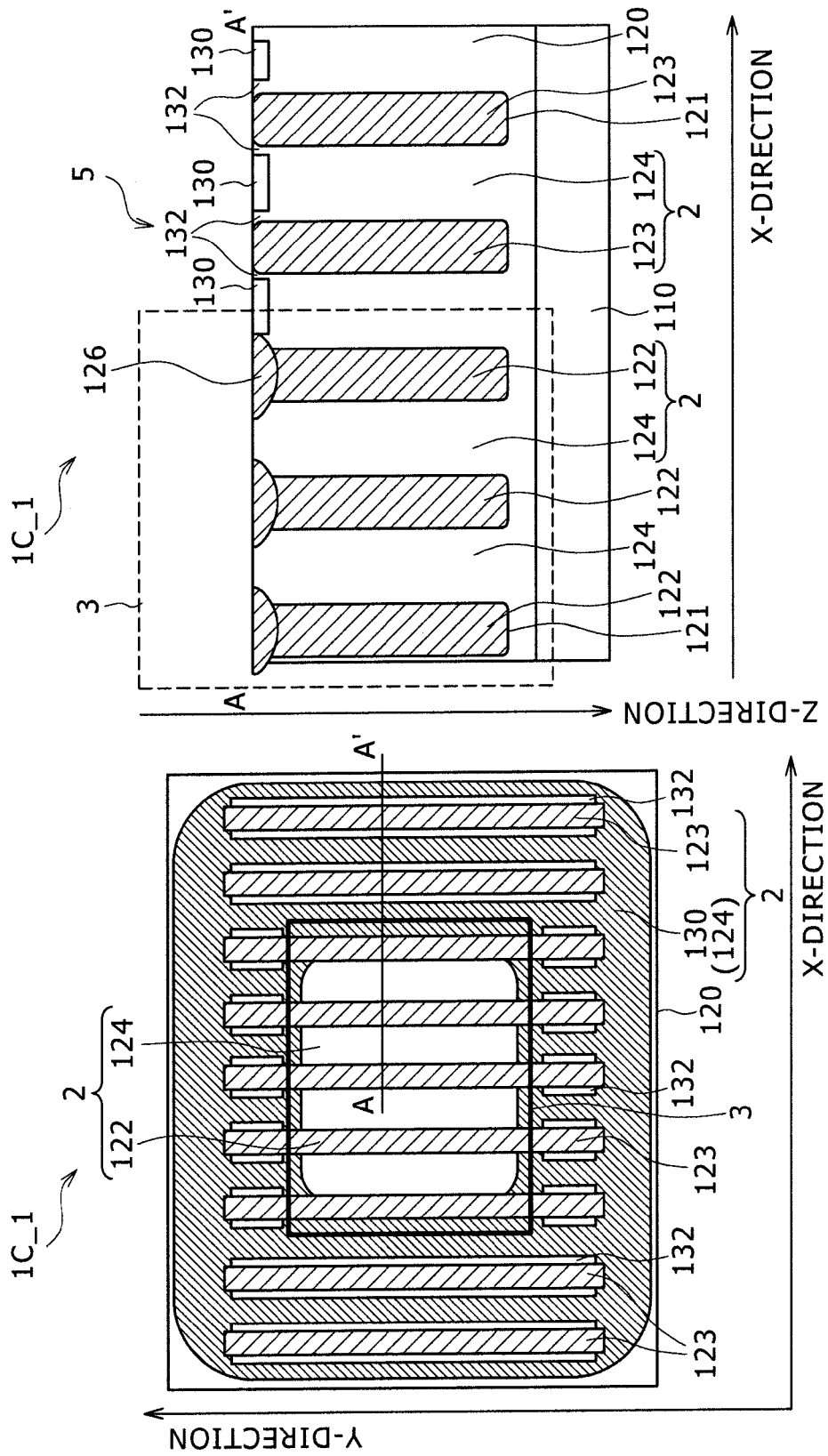

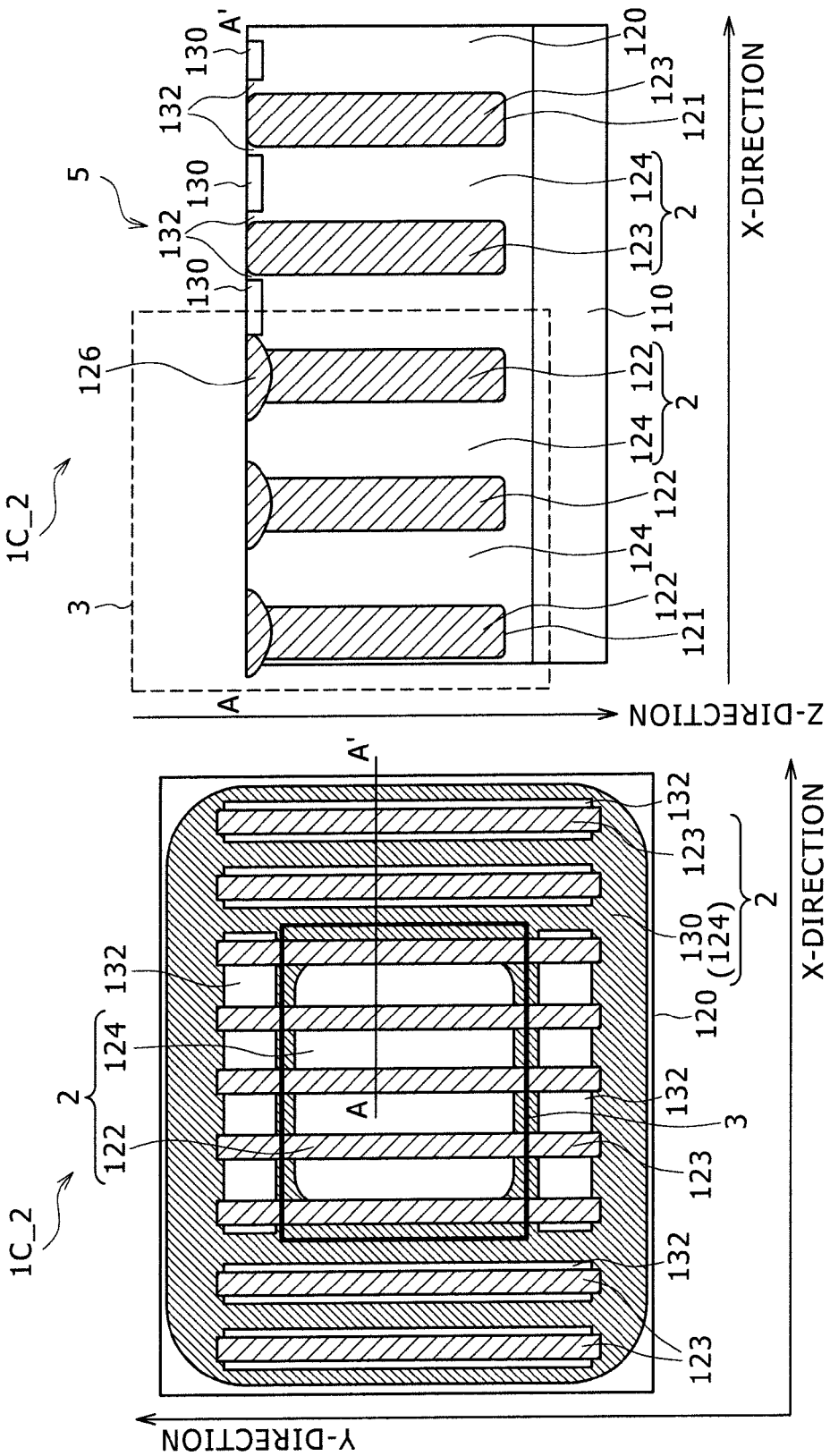

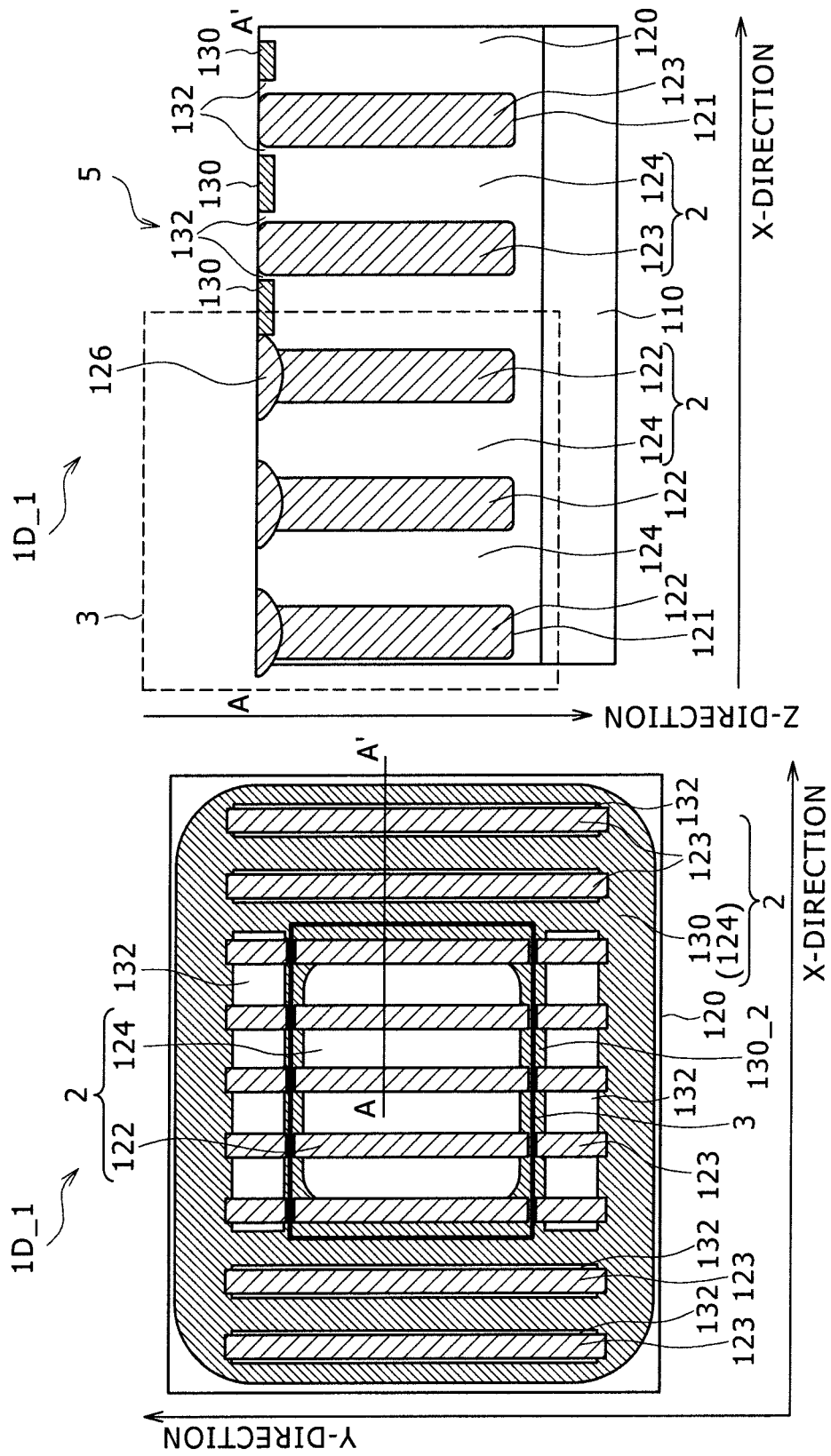

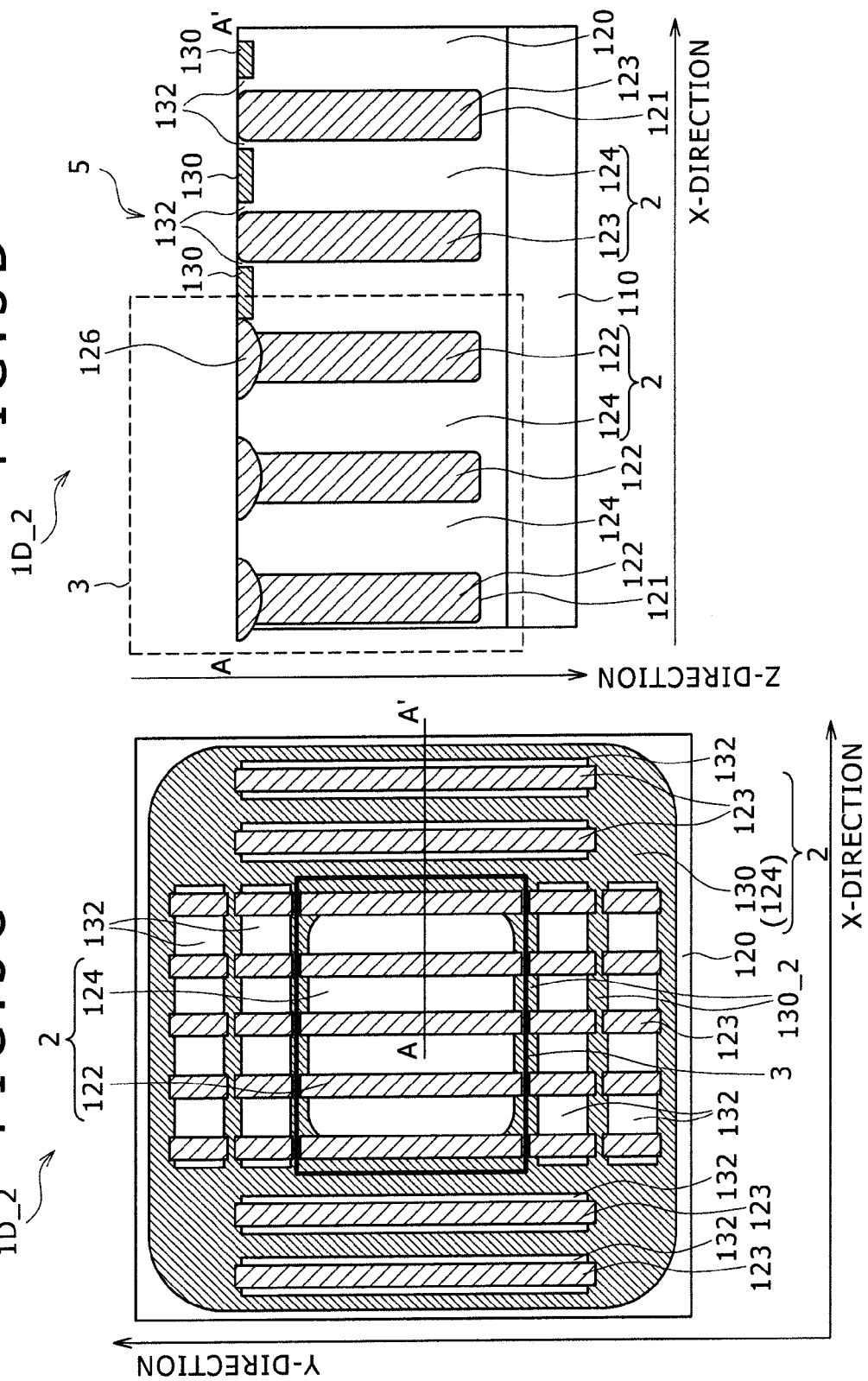

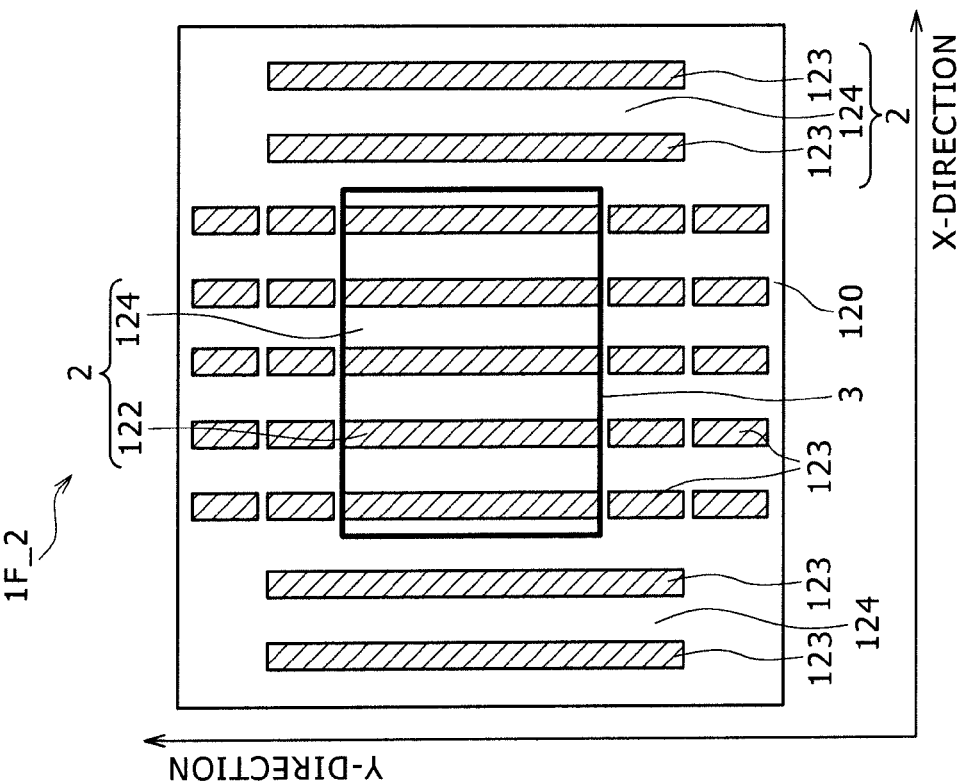
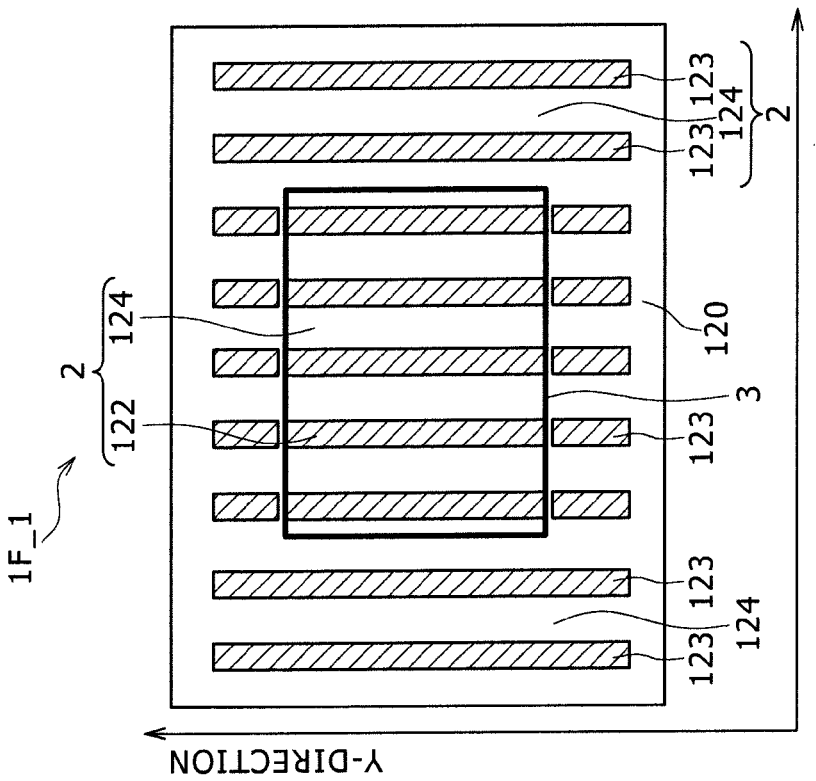

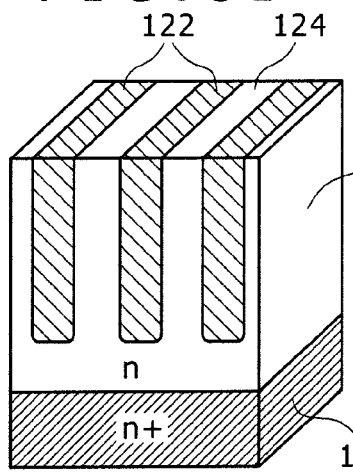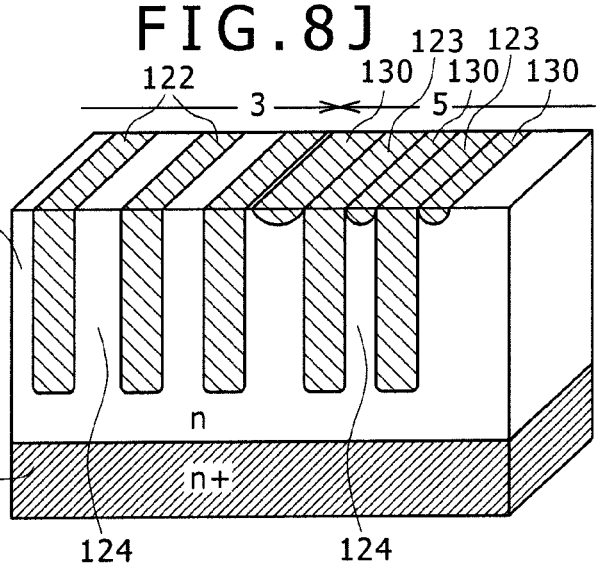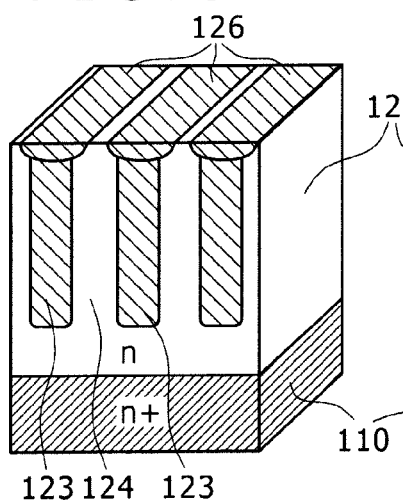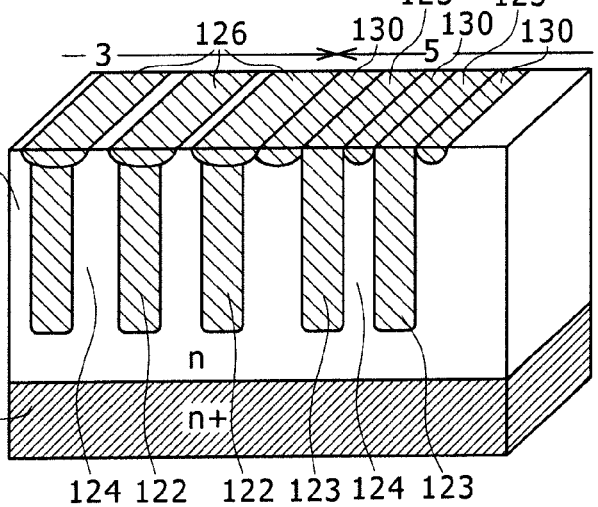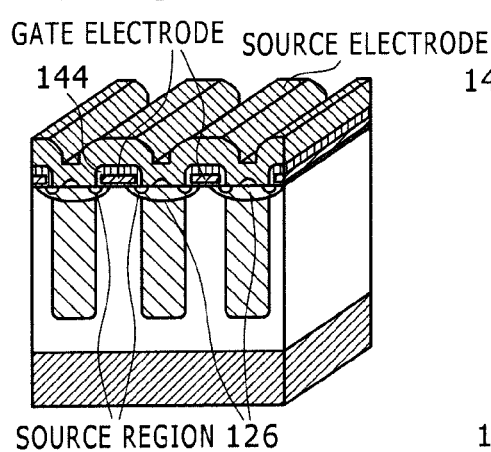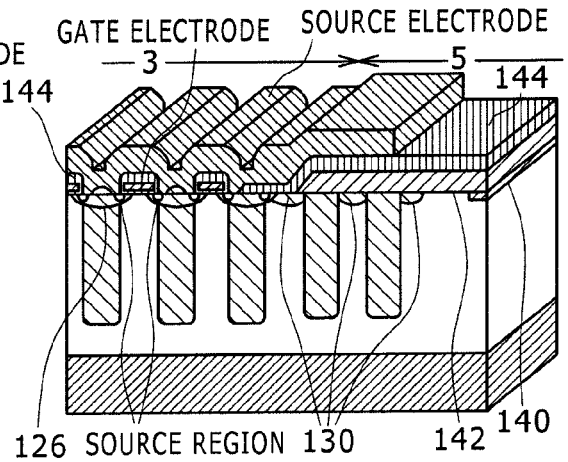

SEMICONDUCTOR DEVICE AND METHOD OF MANUFACTURING THE SAME

The present application claims priority to Japanese Patent Application JP 2008-205325 filed in the Japan Patent Office on Aug. 8, 2008, the entire content of which is hereby incorporated by reference.

BACKGROUND OF THE INVENTION

1. Field of the Invention

The present invention relates to a semiconductor device and a method of manufacturing the same. More particularly, the invention relates to a semiconductor device having a super junction structure and a method of manufacturing the same.

2. Description of the Related Art

In recent years, there has been an increasing demand for reductions in thickness and weight of electronic apparatuses represented by liquid crystal televisions, plasma televisions, organic electroluminescence (EL) televisions, and the like. Attendant on the demand, the request for power supply apparatuses having a reduced size and an enhanced performance has also been becoming stronger. In response to the request, concern about power semiconductor devices has come to be focused on realization of improved performance, such as higher withstand voltage, larger current, lower loss, higher operating speed, and higher breakdown voltage. For example, as a switching element suitable for power electronics application, power Metal-Oxide-Semiconductor Field-Effect Transistor (MOSFET) is known.

The ON-state resistance and withstand voltage of MOSFETs are heavily dependent on the impurity concentration in the N region serving as a conduction layer. The impurity concentration in the conduction layer may be increased in order to lower the ON-state resistance, but, for securing a desired withstand voltage, it is difficult to raise the impurity concentration beyond a certain value. In a MOSFET, the semiconductor region connecting the source region and the drain region to each other is generally called a drift region (drift layer). When the MOSFET is in the ON state, the drift region forms a current path, and when the MOSFET is in the OFF state, the withstand voltage of the MOSFET is maintained by a depletion layer extending from a p-n junction formed between the drift region and the base region.

The ON-state resistance of a MOSFET depends on the electric resistance of the conduction layer (drift region). For realizing a lower ON-state resistance, it may be contemplated to raise the impurity concentration in the drift region, thereby lowering the electric resistance of the drift region. When the impurity concentration in the drift region is increased, however, the extension of the depletion layer would become insufficient, and the withstand voltage would be lowered accordingly. In short, although a lower resistance can be realized by raising the impurity concentration in the drift region, there is a limit to the raising of the impurity concentration, because of the need to secure a desired withstand voltage. Thus, in MOSFETs, a lowered ON-state resistance and an enhanced withstand voltage are in a trade-off relation, and an improvement of this trade-off is being demanded in relation to lower-power-consumption devices.

As a technique for breaking through the trade-off, there is known a technology called a multi-RESURF (reduced surface field) structure or a super junction structure (hereinafter the term "super junction" will be used representatively). The following five documents are cited as relevant to the present invention: Japanese Patent Laid-open Nos. 2002-280555, 2006-005275, 2007-096344, 2007-173418, 2007-116190 (which are here referred to as Patent Documents 1 to 5, respectively).

As shown in Patent Documents 1 to 5, a MOSFET having a drift region of a super junction structure has a configuration in which pillar-shaped p-type semiconductor regions (P regions, p-type pillar regions, p-type vertical RESURF layer) and pillar-shaped n-type semiconductor regions (N regions, n-type pillar regions, n-type vertical RESURF layer) are arranged, alternately or in island form, periodically in a direction parallel to the surface of a semiconductor substrate. Specifically, the MOSFET has a vertical RESURF structure in which p-type pillar regions and the n-type pillar regions are alternately provided repeatedly in a lateral direction, in the semiconductor layers disposed on both sides of the source and drain electrodes.

The withstand voltage is maintained by the depletion layers extending from p-n junctions formed by these semiconductor regions. Even when the extension of the depletion layers is reduced due to an increase in the impurity concentration for obtaining a lowered ON-state resistance, thorough depletion of the semiconductor regions can be achieved by narrowing the width of the semiconductor regions. In the ON state, the N regions of the conduction layer permit a current to flow, whereas in the OFF state, the P regions and the N regions are thoroughly depleted, whereby the withstand voltage can be secured. Consequently, a MOSFET having both a lowered ON-state resistance and an enhanced withstand voltage at the same time can be realized.

Thus, in the super junction structure, the ON-state resistance and the withstand voltage depend on the width of each of the p-type semiconductor regions and the width of each of the n-type semiconductor regions which are each sandwiched between the p-type semiconductor regions. When the respective widths of the p-type semiconductor regions and the n-type semiconductor regions are narrowed further, the impurity concentration in the n-type semiconductor regions can be further raised, whereby a further lowered ON-state resistance and a further enhanced withstand voltage can be attained. From this, it is obvious that the impurity concentration is the point in determining the withstand voltage and the ON-state resistance.

Therefore, in a preferred embodiment, it may be important for a further enhancement of the withstand voltage to make favorable the balance between the impurity in the p-type semiconductor regions and the impurity in the n-type semiconductor regions, i.e., the so-called charge balance. To be more specific, the amount of the impurity contained in the p-type semiconductor region and that in the n-type semiconductor region may be equalized, whereby the impurity concentration is made to be zero on an equivalent basis, and an enhanced withstand voltage can be obtained. In this manner, while a high withstand voltage is maintained by contriving thorough depletion of the P and N regions at the time of a reverse bias (OFF time), a current is permitted to flow through the n-type semiconductor regions doped with the impurity at a high concentration at the time of zero bias (ON time), whereby a device with a lowered ON-state resistance which has been improved beyond the material-based limits can be realized.

In addition, in a semiconductor device having a super junction structure, the withstand voltage and the avalanche withstand capability depend not only on the structure of the region of active operation of the semiconductor device (this region is called a device portion, a device active region portion, an active region portion, a cell region portion, a device body portion or the like, and will hereinafter be referred to representatively as "device portion") but also on the structure of the region so provided as to surround the device portion (this surrounding portion is called a terminal portion, a device periphery portion, a peripheral structure portion, a junction terminal region portion or the like, and will hereinafter be referred to representatively as "terminal portion").

When a difference in the manner of spreading of the depletion layer exists between the device portion and the terminal portion, a difference in optimal impurity concentration would also exists between the two portions. If the device portion and the terminal portion are so produced to have the same impurity amount, therefore, the withstand voltage may be lowered in the terminal portion, and an electric field may be concentrated on the part where the withstand voltage is thus lowered, resulting in breakage of the device. Thus, the device as a whole may fail to have a sufficient withstand voltage.

Besides, where the terminal portion is not provided with the super junction structure, the occurrence of avalanche breakdown would cause, due to electrons and holes generated, an increase in the electric field in an upper part and a lower part of the terminal portion, whereby the breakdown current would be increased, possibly leading to the breakage of the device. In other words, the avalanche breakdown voltage is low in this case.

Taking these points into consideration, it also seems necessary in the case of a MOSFET having a super junction structure to appropriately design the structure of the device portion and the structure of the terminal portion, respectively. Techniques for solving this problem are generally classified into two approaches: one in which a measure is taken while providing also the terminal portion with a super junction structure, and the other in which a measure is taken while not providing the terminal portion with a super junction structure. Patent Documents 2 to 5 each make a proposal relating to a terminal portion structure in which the former approach is adopted.

In a mechanism (or setup) described in Patent Document 2, a device portion is provided with a super junction structure, specifically, a structure including first pillar regions of a first conductivity type and second pillar regions of a second conductivity type. On the other hand, a terminal portion is provided with a super junction structure which is adjacent to the super junction structure of the device portion and of which the thickness in the vertical direction is smaller than that in the device portion. Further, for securing a withstand voltage in the terminal portion, the impurity concentration in n-type semiconductor regions in the terminal portion is set lower than the impurity concentration in n-type semiconductor regions in the device portion. For example, in the terminal portion, third pillar regions of the first conductivity type and fourth pillar regions of the second conductivity type are formed. Besides, in the state of being layered over the third or fourth pillar region, closest to the device portion, of the super junction structure of the terminal portion, an outermost pillar region lower than the first and second pillar regions in impurity concentration is additionally formed at the outermost portion, closest to the terminal portion, of the super junction structure of the device portion. Further, a high-resistance layer of the first conductivity type higher in resistance than the pillar regions is formed over the third pillar regions and the fourth pillar regions.

In Patent Document 3, also, for securing a withstand voltage in a terminal portion, the impurity concentration in n-type semiconductor regions in the terminal portion is set lower than the impurity concentration in n-type semiconductor regions in a device portion. For instance, the ion implantation area for a second conductivity type partition region on the outermost side is set to be smaller than the ion implantation area for each region of parallel p-n layer on the inner side thereof, so as to ensure that the second conductivity type partition region on the outermost side and each region of parallel p-n layer on the inner side thereof are approximately equal in net amount of impurity.

In Patent Document 4, similarly, a terminal portion is provided with a super junction different from that provided in a device portion. For example, n-type regions and p-type regions are provided in parallel over a principal surface of an $n^+$ layer in the terminal portion, a high-resistance semiconductor layer is provided over the n-type regions and the p-type regions, and n-type regions and p-type regions are provided in parallel over the high-resistance semiconductor layer. The impurity concentration in at least one kind of n-type pillar regions and p-type pillar regions is gradually varied along the direction of from a first main electrode (source electrode) toward a second main electrode (drain electrode) so that the amount of impurity in the n-type pillar region is smaller than the amount of impurity in the p-type pillar region on the first main electrode side, whereas the amount of impurity in the n-type pillar region is larger than the amount of impurity in the p-type pillar region on the second main electrode side.

In Patent Document 5, in the case of forming a device portion in which a drift current flows and a terminal portion surrounding the device portion, the terminal portion is provided with a second n-type drift layer and a second p-type drift layer formed along at least one of two directions which are orthogonal to each other.

On the other hand, as a method for fabricating a super junction structure, the following three techniques may be considered.

(1) A method in which an n-type impurity and a p-type impurity are each individually introduced into an epitaxial layer (epitaxial silicon) by ion implantation, and the epitaxial structure is layered repeatedly a number of times (this method will be referred to as first fabrication method). This is a multi-epitaxial fabrication method in which similar epitaxial growth is repeated a number of times.

(2) A method in which trenches are formed in a thick epitaxial layer, an impurity is provided at side surfaces of each of the trenches by such method as diffusion, and an insulating material or a non-conducting material is buried there (this method will be referred to as second fabrication method).

(3) A method in which trenches are formed in a thick epitaxial layer, and the trenches are filled up with impurity-containing silicon by epitaxial growth (this method will be referred to as third fabrication method). This is a method in which the trenches once formed are backfilled by epitaxial growth (a trench forming and epitaxially backfilling fabrication method).

SUMMARY OF THE INVENTION

Here, comparing the first to third fabrication methods with one another, the third method is considered to possibly promise realization of a super junction structure with a high degree of integration through a small number of steps.

However, the third fabrication method has problems as to the conditions for not producing defects at the time of epitaxial growth into the trenches and as to control of the amount of the doping impurity (dopant) introduced. Since the epitaxial growth rate and the impurity concentration vary depending on the orientation of the crystal plane appearing at the time of formation of the trenches, it may be required to determine process conditions under which these factors can be accurately controlled and a defect-free structure can be fabricated with good productivity.

In addition, in relation to the formation of a super junction structure by the third fabrication method, a mechanism (setup) by which an appropriate terminal portion structure can be obtained has not yet been established. It is considered necessary to take into adequate consideration the layout of trenches in the device portion and that in the terminal portion, but the mechanism (principle) relating to it has not yet been established.

Thus, there is a need for an established mechanism by which a semiconductor device having a super junction structure can be fabricated through a simple process while securing a good withstand voltage also in a peripheral part of a device portion.

According to an embodiment of the present invention, both a device portion and a terminal portion surrounding the device portion, of a semiconductor device, are formed to have a super junction structure in which first pillar regions of a first conductivity type and second pillar regions of a second conductivity type are arranged in paired state and alternately. In addition, the terminal portion of a second semiconductor region having the super junction structure is provided with a lateral RESURF region of the second conductivity type. Here, each of the second pillar regions in the terminal portion lacks the lateral RESURF region at least at a part of a surface portion thereof. This means that at least a part of the surface portion of each second pillar region in the terminal portion is in the state of being not covered with (the state of being free of overlap with) the lateral RESURF region. Preferably, the lateral RESURF region is provided, at a position corresponding to each second pillar region, with an aperture larger in size than the second pillar region, whereby an overlap-free condition is attained along the array direction of the second pillar region.

The semiconductor device is fabricated by the simple process in which both the device portion and the terminal portion surrounding the device portion are formed to have a super junction structure. Since the lateral RESURF region functioning as a depletion layer extension region is present in the terminal portion, the region which is depleted when a drain voltage is impressed (at OFF time) is extended into the terminal portion, so that concentration of electric field is prevented from occurring. As a result, a structure is obtained in which the withstand voltage can be enhanced while keeping high the impurity concentration in the second semiconductor region in the terminal portion. Since the impurity concentration in the first pillar regions in the device portion and the impurity concentration in the first pillar regions in the terminal portion can be set to be the same, the process design for the super junction structures is simplified.

In addition, even after the formation of the lateral RESURF region, the lateral RESURF region is absent at least at a part of the surface portion of each second pillar region in the terminal portion, and, therefore, the area of overlap between the lateral RESURF region and the second pillar regions is reduced. Consequently, the phenomenon in which the impurity concentration is raised due to the overlap is suppressed or prevented. In other words, the phenomenon of failure in satisfying the depleting conditions which is liable to arise from the overlap is moderated or obviated.

The structure according to the first embodiment of the invention as above can be fabricated as follows. Both the device portion and the terminal portion surrounding the device portion are formed to have the super junction structure in which the first pillar regions of the first conductivity type and the second pillar regions of the second conductivity type are arranged in paired state and alternately. In this case, a second semiconductor region of the first conductivity type of the super junction structure is formed over a first semiconductor region of the first conductivity type. Then, by use of a mask which covers the device portion entirely and covers the second pillar regions in the terminal portion, the lateral RESURF region is formed at a surface portion of the second semiconductor region in the terminal portion.

According to a second embodiment of the present invention, both a device portion and a terminal portion surrounding the device portion, of a semiconductor device, are formed to have a super junction structure in which first pillar regions of a first conductivity type and second pillar regions of a second conductivity type are arranged in paired state and alternately. In addition, each of the second pillar regions is formed by filling up each of trenches, formed in a second semiconductor region, with a semiconductor of the second conductivity type by epitaxial growth, whereas each of the first pillar regions is composed of a region sandwiched between the second pillar regions. Furthermore, the second pillar regions are arrayed in the second semiconductor region in stripes in the same direction and in the same depth throughout the whole area of the device portion and the terminal portion, and their width in the array direction and their array pitch are the same at the same depth position in the device portion and the terminal portion. Incidentally, it is preferable to adopt the first embodiment and the second embodiment in combination.

The semiconductor device is formed by the simple process in which both the device portion and the terminal portion surrounding the device portion are formed to have a super junction structure. In addition, by forming the trenches in the same form (in the same depth, width, and pitch) throughout the device (the device portion and the terminal portion), the crystal plane orientation and the shape (rectangular stripes having a longitudinal direction) are fixed, and the etching shape is kept constant. Further, at the time of filling up the trenches by epitaxial growth, the epitaxial growth conditions are maintained stably because the crystal plane orientation and the trench shape are constant. In this structure, the striped pillar structure formed by forming the trenches and filling up the trenches through epitaxial growth and the structure of the peripheral high-withstand-voltage region can be fabricated stably.

The structure according to the second embodiment of the invention as above may be fabricated as follows. The second semiconductor region of the first conductivity type is formed over the first semiconductor region of the first conductivity type, the second semiconductor region is provided with the trenches in stripes in the same direction and in the same depth in the device portion and the terminal portion, so as to form the first pillar regions of the first conductivity type. Then, the trenches are filled up with the semiconductor of the second conductivity type so as to form the second pillar regions of the second conductivity type.

According to the present invention, a semiconductor device can be fabricated by the simple process in which both a device portion and a terminal portion surrounding the device portion are formed to have a super junction structure.

In addition, according to the first embodiment of the invention, the overlap of the lateral RESURF region with the second pillar regions is controlled. As a result, stable enhancement of withstand voltage can be realized in the terminal portion. Besides, according to the second embodiment of the invention, characteristics in the terminal portion are made stable, and a rise in withstand voltage can be promised in the terminal portion.

BRIEF DESCRIPTION OF THE DRAWINGS

FIGS. 1A and 1B are sectional views showing schematically the structure of a semiconductor device according to a first comparative example;

FIGS. 2A and 2B show schematically the configuration of a semiconductor device according to a first embodiment of the present invention;

FIGS. 2C and 2D illustrate a bad influence produced in the case where a lateral RESURF structure is applied to a super junction structure;

FIGS. 3A and 3B show schematically the configuration of a semiconductor device according to a second embodiment (first example) of the invention;

FIGS. 3C and 3D show schematically the configuration of a semiconductor device according to a second embodiment (second example) of the invention;

FIGS. 3E and 3F illustrate a bad influence produced in the case where a lateral RESURF structure is applied to a super junction structure in the second embodiment;

FIGS. 4A and 4B show schematically the configuration of a semiconductor device according to a third embodiment (first example) of the invention;

FIGS. 4C and 4D show schematically the configuration of a semiconductor device according to the third embodiment (second example) of the invention;

FIGS. 5A and 5B show schematically the configuration of a semiconductor device according to a fourth embodiment (first example) of the invention;

FIGS. 5C and 5D show schematically the configuration of a semiconductor device according to the fourth embodiment (second example) of the invention;

FIGS. 7A and 7B show schematically the configuration of a semiconductor device according to a sixth embodiment of the invention;

FIGS. 8I to 8N are views (Part 2) for illustrating techniques in the method of manufacturing a semiconductor device according to the first to fourth embodiments.

DETAILED DESCRIPTION OF THE PREFERRED EMBODIMENTS

Figure 1C:
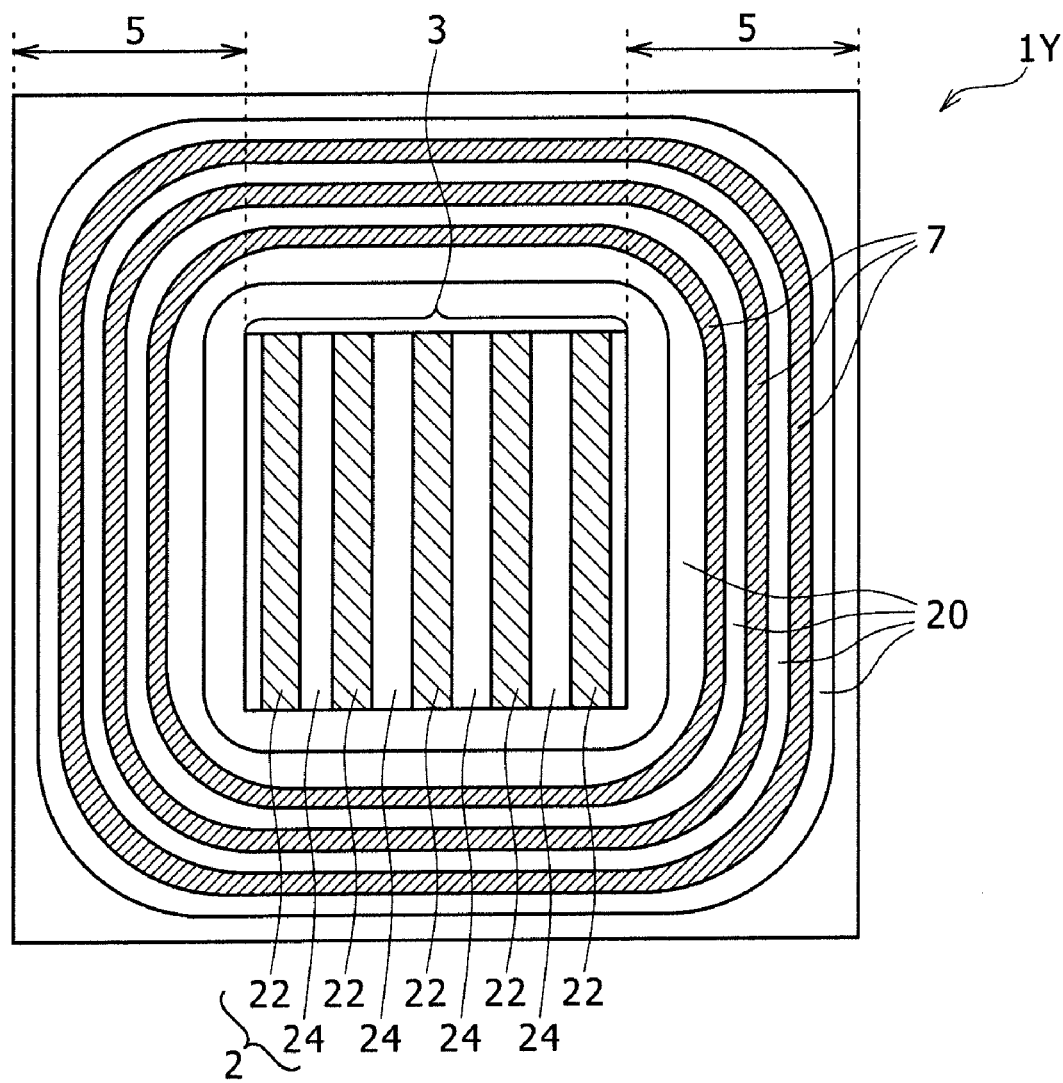
FIG. 1C is a plan view showing schematically the structure of a semiconductor device according to a second comparative example.

Now, embodiments of the present invention will be described in detail below, referring to the drawings. When functional elements for the same function are to be distinguished on an embodiment basis, their reference symbols will be accompanied by an alphabetical (capital) adscript, such as A and B; when the functional elements for the same function are to be described without special distinction, the reference symbols will be used while omitting the adscript. This applies also in the drawings.

In the following description, silicon (Si) is used as the base material, the first conductivity type is assumed to be n type, and the second conductivity type is assumed to be p type, unless otherwise specified. In addition, expressions "n$^-$," "n," "n$^+$," "p$^-$," "p," and "p$^+$" will be used to indicate the concentrations of the n-type and p-type impurities. With "n" taken as a reference, "n$^+$" indicates a higher n-type impurity concentration, while "n$^-$" indicates a lower n-type impurity concentration, and the same applies also to the p type. As the number of "−" or "+" signs is greater, the degree of lowness or highness of the impurity concentration is greater.

Comparative Examples

FIGS. 1A to 1C illustrate comparative examples for the semiconductor device according to the present invention. Here, FIGS. 1A and 1B are sectional views showing schematically the structure of a semiconductor device 1X according to a first comparative example, and FIG. 1C is a plan view showing schematically the structure of a semiconductor device 1Y according to a second comparative example.

The semiconductor device 1X is a power MOSFET having a structure in which a multiplicity of device cells of a parallel p-n structure are arranged in parallel. As shown in FIGS. 1A and 1B, the semiconductor device 1X has a structure in which n-type epitaxial layers 20 lower in impurity concentration than an n-type high-concentration substrate 10 (n+ type drain layer) serving as an example of a first conductivity type semiconductor layer having a comparatively high impurity concentration are provided at predetermined intervals over a surface of the n-type high-concentration substrate 10. The layer intervals are substantially the same, except for that relating to the lowermost one (on the n-type high-concentration substrate 10 side) of the n-type epitaxial layers 20.

The n-type epitaxial layers 20 are each divided into a device portion 3 (super junction device region) having device cells 2 of a parallel p-n structure composed of a pair of a p-type semiconductor region (p-type pillar region) and an n-type semiconductor region (n-type pillar region), and a terminal portion 5 (peripheral structure region) provided so as to surround the device portion 3. In the device portion 3, p-type pillar diffusion layers 22 (p-type drift layers) and n-type pillar diffusion layers 24 (n-type drift layers) are formed at predetermined pillar pitches (equal to the pitch of the n-type epitaxial layers 20) in the n-type epitaxial layers 20. The p-type pillar diffusion layer 22 and the n-type pillar diffusion layer 24 sandwiched between the p-type pillar diffusion layers 22 form a super junction structure. The p-type pillar diffusion layers 22 and the n-type pillar diffusion layers 24 are respectively formed in the shape of stripes extending in the direction orthogonal to the plane of paper of the drawing. In the vicinity of a surface, on the opposite side from the n-type high-concentration substrate 10, of each of the p-type pillar diffusion layer 22, a p-type base region 26 is selectively formed so as to be connected to the p-type pillar diffusion layer 22.

An example of dimensions of each of the pillar diffusion layers 22, 24 is such as to satisfy the relation: $C \approx 7.2 \times 10^{16} \cdot V_b^{-0.2}/b$ cm$^{-3}$, where Vb is breakdown voltage (or withstand voltage), the pillar diffusion layers 22, 24 have a depth (thickness) D $(=\alpha \cdot V_b^{1.2}$, for example, $\alpha=0.024)$ μm and a width W, and C is impurity concentration. In other words, the depth D and width W of the pillar diffusion layers 22, 24 depend on the withstand voltage (=breakdown voltage Vb) and the impurity concentration C. In the case where a withstand voltage of about 500 to 800 V is demanded, the width W is set to be about 1 to 10 μm, the depth D is set to be about 30 to 80 μm, and the impurity concentration is set in accordance with them. As is seen from these dimensions, the pillar diffusion layers 22 and 24 are small in width W and large in depth D (namely, they are high in aspect ratio).

Though not shown in the figures, a drain electrode (first main electrode) electrically connected to the n-type high-concentration substrate 10 is formed at a surface, on the opposite side from the n-type epitaxial layers 20, of the n-type high-concentration substrate 10. In addition, an n$^+$ source region and a contact region in contact with a source electrode is formed at a surface portion of the p-type base region 26. The source electrode (second main electrode) is formed so as to make contact with the surfaces of the n$^+$ source region and the p-type base region 26. Besides, on the same surface side as the source electrode of the n-type epitaxial layers 20, a gate (control electrode) is formed over the surfaces of each n-type pillar diffusion layer 24 sandwiched between adjacent ones of the p-type base regions 26 and the surfaces of the adjacent p-type base regions 26 and the n$^+$ source region, through a gate insulating film therebetween, in such a manner as to be surrounded by the source electrode. The p-type base regions 26, the n$^+$ source regions, the source electrodes and the gate electrodes are also formed in the shape of stripes extending in the same direction as the p-type pillar diffusion layers 22 and the n-type pillar diffusion layers 24. With such a structure, the semiconductor device 1X constitutes an electron implantation n-channel MOSFET in which a surface portion of the p-type base region 26 just beneath the gate insulating film serves as a channel region.

Here, in a power MOSFET having the super junction structure, it is essential that the structure of the region of active operation of the semiconductor device (the region corresponding to the device portion 3 in the semiconductor device 1X) and the structure of the device peripheral portion (corresponding to the terminal portion 5 in the semiconductor device 1X) should respectively be designed appropriately. Particularly, in the terminal portion 5, securing a high withstand voltage is requested more keenly than in the device portion 3. In other words, the withstand voltage characteristic in the terminal portion 5 can be a factor which is determinative of the device characteristics of the power MOSFET.

In the terminal portion 5, if the p-type pillar regions (corresponding to the p-type pillar diffusion layers 22 in the semiconductor device 1X) and the n-type pillar regions (corresponding to the n-type pillar diffusion layers 24 in the semiconductor device 1X) are thoroughly depleted in the condition where a voltage is impressed on the drain regions in an OFF state, the withstand voltage is determined depending on the thickness of the depletion layers in the vertical direction. Therefore, it is possible to lower the ON-state resistance by increasing the impurity concentration in the n-type pillar regions. In the terminal portion 5, however, it is essential to secure the withstand voltage while taking into account that the depletion layers are extended laterally in the OFF state. Further, it is also important to make such a contrivance as to prevent the electric field from reaching a critical electric field in the depletion layers extended laterally.

Specifically, in a semiconductor device for power application such as a switching MOSFET device for power supply application, in order to secure a high withstand voltage of, for example, not less than 500 V, a super junction structure or a multi-RESURF structure in which P regions and N regions are alternately arranged repeatedly and they are thoroughly depleted at the time of a reverse bias is used. A combination of this technology with MOSFET makes it possible to realize a switching device with both a lowered ON-state resistance and an enhanced withstand voltage. However, this device structure alone is not sufficient, and it is essential that layout and structure should be so adapted that the peripheral structure (terminal structure) of the chip has a withstand voltage of not less than the device withstand voltage.

As an example of such a measure, there may be contemplated a combination of the terminal portion 5 with a guard ring, a field plate, a p-type lateral RESURF, or the like. For instance, in a semiconductor device 1Y according to a second comparative example shown in FIG. 1C, a guard ring is applied to the semiconductor device 1Y. On the side of that surface of a terminal portion 5 which is on the side of the boundary between a device portion 3 and the terminal portion 5, a plurality of guard ring portions 7 are provided (in multiple form) so as to surround the periphery (the four sides) of the device portion 3. Incidentally, the terminal portion 5 of the semiconductor device 1Y is provided with neither p-type pillar diffusion layer (n-type drift layer) nor n-type pillar diffusion layer (p-type drift layer), and it is provided with an n-type semiconductor layer (n-type epitaxial layer 20). At a surface portion of the n-type epitaxial layer 20, the plurality of the guard ring portions 7 formed from p-type semiconductor are selectively formed so as to surround the four sides of the device portion 3. Such a guard ring structure, however, would lead to an increase in the area of the terminal portion 5.

Besides, as a modification, a configuration may be contemplated in which a super junction structure similar to that in the device portion 3 is applied also to the terminal portion 5, and guard ring portions 7 are arrayed at the surface thereof. In this case, however, the guard ring structure has a difficulty in optimization, since optimization of the stripe width and interval of p-type pillar diffusion layers 22 and n-type pillar diffusion layers 24 (or trenches, where they are formed by use of trenches) is important and it is highly necessary to take into account the dependence on crystal plane orientation.

In addition, a combination of a striped super junction structure with guard ring portions 7 surrounding the periphery (the four sides) of the device portion 3 has a problem in that a suitable method for realizing the combination has not yet been established. Specifically, the impurity concentration would be raised in overlapping areas where the p-type pillar diffusion layer 22 and the p-type guard ring portion 7 are both formed. It is therefore very important to design the device while paying attention to the demerit (lowering of withstand voltage, worsening of electric field balance, or the like) arising from the raised impurity concentration.

Besides, though not shown in the drawing, application of a field plate or a lateral RESURF to the terminal portion 5 will necessarily lead to an increase in the number of manufacturing steps, and is considered to necessitate a structure which is inexpensive and is good in affinity for the device structure process.

Meanwhile, as a method for fabricating a super junction structure, the following three techniques may be considered. (1) A first fabrication method (multi-epitaxial fabrication method) in which an n-type impurity and a p-type impurity are each individually introduced into an epitaxial layer (epitaxial silicon) by ion implantation, and the epitaxial structure is layered repeatedly a number of times.
(2) A second fabrication method in which trenches are formed in a thick epitaxial layer, an impurity is provided at side surfaces of each of the trenches by such method as diffusion, and an insulating material or a non-conducting material is buried there.
(3) A third fabrication method (trench forming and epitaxially backfilling fabrication method) in which trenches are formed in a thick epitaxial layer, and the trenches are filled up with impurity-containing silicon by epitaxial growth.

In the courses of embodying these methods, there are various problems, some of which will be specifically described below. In the first place, the first fabrication method is applied to manufacture of the semiconductor device 1X. An n-type epitaxial layer 20 having a high resistance is grown in a thickness of about 10 μm over a wafer substrate (n-type high-concentration substrate 10), p-type semiconductor regions and n-type semiconductor regions are formed therein by ion implantation, then an n-type epitaxial layer (n-type epitaxial layer 20) having a high resistance is further grown, and p-type semiconductor regions and n-type semiconductor regions are formed therein. Such steps are repeated about five to ten times to form p-type pillar diffusion layers 22 and n-type pillar diffusion layers 24. For example, the n-type epitaxial layer 20 is formed in a divisional manner by repeating epitaxial growth a number of times (for example, six times in the semiconductor device 1X_1 shown in FIG. 1A). The six epitaxial layers 20_1 to 20_6 formed respectively by the growth steps are stacked, whereby the n-type epitaxial layer 20 is formed. The p-type pillar diffusion layers 22 and the n-type pillar diffusion layers 24 are formed by a process in which pluralities of diffusion layers 22_1 to 22_6 and 24_1 to 24_6 formed in the n-type epitaxial layer 20 by ion implantation and diffusion are respectively joined to one another in the depth direction.

Therefore, in the first fabrication method referred to also as multi-epitaxial fabrication method, the n-type semiconductor regions and the p-type semiconductor regions can be formed in profiles which are different between the device portion 3 and the terminal portion 5. This method is characterized in that the desired structure can be realized comparatively easily and free fabrication of impurity profiles in the device portion 3 and the terminal portion 5 can be easily realized by suitably devising the amounts of impurities introduced into the layers being stacked and the patterns thereof.

In this fabrication method, however, the structure is complicated because the p-type pillar diffusion layers 22 and the n-type pillar diffusion layers 24 are alternately arranged from the silicon surface to a depth of about 40 to 80 μm. In addition, the fabrication steps are complicated because the numbers of working steps in repeating the ion implantation and epitaxial growth for obtaining the stacked structure are comparatively large. Further, due to the necessary and sufficient diffusion temperature and time for respectively joining the p-type and n-type pillar diffusion layers 22 and 24 along the vertical direction, lateral diffusion of impurities is not ignorable, so that a further contrivance may be required for attaining a comparatively finer structure. On the other hand, an attempt to decrease the diffusion temperature and/or time necessitates a reduction in the thickness of the epitaxial layer per epitaxial growth step, which corresponds to an increase in the number of the epitaxial layers stacked in a repeated manner, leading to a further increase in the above-mentioned working steps (increased to eight times, in the semiconductor device 1X_2 shown in FIG. 1B). In short, a reduction in chip size and a lowering in wafer cost are in a trade-off relationship.

In the second fabrication method, the selection of the insulating material to be buried is important, and it may be necessary to take care of the dielectric breakdown voltage of the material and the interface between the material and silicon (Si) constituting the substrate. Further, the difference in coefficient of thermal expansion between the buried insulating material and silicon (Si) influences the generation of crystal defects which will possibly occur in later heat treatments, so that prevention of the crystal defect generation may be needed.

On the other hand, in forming the device cells 2 of the parallel p-n structure in the semiconductor device 1X, application of the third fabrication method may be contemplated.

In this case, an n-type epitaxial layer is grown in a thickness of 40 to 80 μm over a wafer substrate, a striped pattern is formed there, and the n-type epitaxial layer is etched in trench shapes so as to form trenches of which the depth (for example, about 30 to 70 μm) is comparable to or slightly smaller than the thickness of the n-type epitaxial layer. Thereafter, the trenches are backfilled with a p-type semiconductor by epitaxial growth. According to the third fabrication method, it may be possible to realize a highly integrated super junction through a reduced number of steps.

However, this method has problems as to the conditions for not generating defects at the time of epitaxial growth into the trenches and as to control of the amount of doping impurity (dopant) introduced. Particularly, the epitaxial growth rate and the impurity concentration vary depending on the orientation of the crystal plane appearing upon formation of the trenches. Therefore, it is important to determine process conditions under which these factors can be accurately controlled and a defect-free structure can be fabricated with good productivity. In addition, sufficient care has to be taken of the layout of the trenches in the device portion 3 and the trenches in the terminal portion 5.

In each of embodiments of the present invention, while adopting the third fabrication method, at least one of the above-mentioned problems is improved, so as to realize a super junction type semiconductor device capable of attaining a higher withstand voltage and a higher avalanche breakdown voltage, as compared with those according to the related art. Specifically, a semiconductor device structure suitable for realizing a device peripheral portion capable of favorably securing a withstand voltage and a method of manufacturing the same are realized by forming a super junction structure by the third fabrication method, which resides in a simple process, and improving at least one of the above-mentioned problems. Now, the embodiments of the invention will be described specifically below.

First Embodiment

Figure 2E:
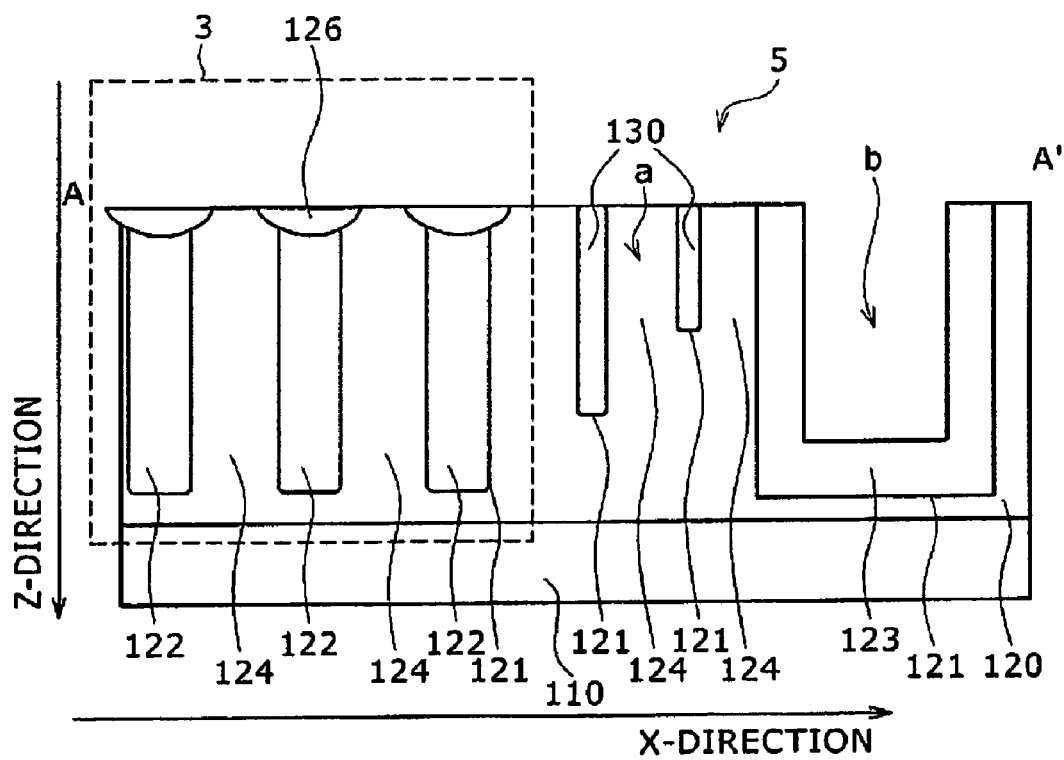
FIG. 2E illustrates bad influences of changes in trench width and crystal plane orientation of a super junction structure in the case of application of the third fabrication method.

FIGS. 2A to 2E illustrate a semiconductor device 1A according to a first embodiment of the present invention. Here, FIGS. 2A and 2B show schematically the configuration of the semiconductor device 1A, wherein FIG. 2A is an XY plan view of the semiconductor device 1A, and FIG. 2B is an XZ sectional view taken along line A-A' of FIG. 2A. Each of these figures is a schematic view and the dimensions in the drawing are not limitative, the same applying also to figures in the other embodiments. FIGS. 2C and 2D illustrate a bad influence produced in the case where a lateral RESURF structure is applied to a super junction structure. FIG. 2E illustrate bad influences produced when the trench width and the crystal plane orientation of a super junction are changed in the case of applying the third fabrication method. For example, in part (a): if the trench aperture size (width) is too small, the etching depth would be small and unstable; in part (b): if the trench aperture size (width) is too large, it would be impossible to fill up the trenches by subsequent epitaxial growth; and in other cases: if the direction of the trench aperture is changed, filling-up of the trenches would become impossible due to the influence of substrate plane orientation, and abnormal growth or the like would occur.

The semiconductor device 1A in the first embodiment has, at a surface of an n-type high-concentration substrate 110 ($n^+$ type drain layer) serving as an example of a first semiconductor region of a first conductivity type having a comparatively high impurity concentration, an n-type epitaxial layer 120 (a second semiconductor region of the first conductivity type)

lower in impurity concentration than the n-type high-concentration substrate 110. Though not shown in the figures, a drain electrode (first main electrode) is formed at a surface, on the opposite side from the n-type epitaxial layer 120, of the n-type high-concentration substrate 110.

The n-type epitaxial layer 120 is divided into a device portion 3 (super junction device region) in which device cells 2 each having a parallel p-n structure composed of a pair of a p-type semiconductor region (p-type pillar region) and an n-type semiconductor region (n-type pillar region) are provided, and a terminal portion 5 (peripheral structure region) provided so as to surround the device portion 3. In an example, the device portion 3 is a few millimeters (for example, 2 to 5 mm) square, and the terminal portion 5 is a several hundreds of micrometers square.

In the device portion 3, a plurality of p-type epitaxial fill-up layers 122 (second pillar regions of a second conductivity type) constituting a super junction structure are formed in trenches 121 by epitaxial growth; similarly, in the terminal portion 5 also, a plurality of p-type epitaxial fill-up layers 123 (second pillar regions of the second conductivity type) constituting a super junction structure are formed in trenches 121 by epitaxial growth. Specifically, the p-type epitaxial fill-up layers 122 and 123 are formed not only in the device portion 3 but also in the terminal portion 5, in the range from the n-type high-concentration substrate 110 side toward the opposite side in the n-type epitaxial layer 120, in the state of being arranged periodically in a predetermined direction. By this, the super junction structures are formed, and the p-type epitaxial fill-up layers 122 and 123 function as p-type drift layers. In addition, of the n-type epitaxial layer 120, the n-type epitaxial layer 124 portions (first pillar regions of the first conductivity type) each sandwiched by the p-type epitaxial fill-up layers 122, 123 function as n⁻ type drift layers.

The n-type epitaxial layer 120 is set at the same impurity concentration throughout the body thereof, whereby the n-type epitaxial layers 124 in the device portion 3 and the terminal portion 5 have the same impurity concentration. Besides, the impurity concentration at the time of filling up the trenches 121 in the device portion 3 and that in the terminal portion 5 are set to be the same, whereby the p-type epitaxial fill-up layers 122 and 123 are formed to have the same impurity concentration.

Though omitted in the figures, at the peripheral edge of the terminal portion 5, a channel stopper is formed at a surface portion on the source electrode side of the n-type epitaxial layer 120 (see the figures for the fabrication method to be described later). This applies also in the other embodiments to be described later. In the vicinity of a surface, on the opposite side from the n-type high-concentration substrate 110, of each of the p-type epitaxial fill-up layers 122, a p-type base region 126 is selectively formed so as to be connected to the p-type epitaxial fill-up layer 122.

Though not shown in the figures, an n⁺ source region and a contact region making contact with a source electrode is formed at a surface portion of the p-type base region 126. The source electrode (second main electrode) is formed so as to make contact with the surfaces of the n⁺ source region and the p-type base region 126. On the same surface side as the source electrode of the n-type epitaxial layer 120, a gate (control electrode) is formed at the surface of the n-type epitaxial layer 124 sandwiched between adjacent ones of the p-type base regions 126 and the surfaces of the adjacent p-type base regions 126 and the n⁺ source region, through a gate insulating film therebetween, in the manner of being surrounded by the source electrode.

As a whole, the semiconductor device 1A has a super junction structure in which the p-type epitaxial fill-up layers 122, 123 and the n-type epitaxial layers 124 are arranged alternately and repeatedly in the n-type epitaxial layer 120 formed over the n-type high-concentration substrate 110. The n-type high-concentration substrate 110 on the lower surface side of the semiconductor device 1A serves as a high-voltage electrode (drain electrode), while the opposite side from the n-type high-concentration substrate 110 serves as a low-voltage electrode (source electrode), and the low-voltage electrode is used normally at a ground potential.

The p-type pillar regions (p-type epitaxial fill-up layers 122, 123) and the n-type pillar regions (n-type epitaxial layer 124) form pairs of p-type pillar-shaped semiconductor regions and n-type pillar-shaped semiconductor regions on a sectional structure basis. In other words, the p-type epitaxial fill-up layers 122, 123 are arranged in the shape of pillars (extending in Y-direction) in the n-type epitaxial layer 120 constituting the n-type pillar regions. As a result, the n-type epitaxial layers 124 as the n-type pillar-shaped semiconductor regions each sandwiched between the p-type epitaxial fill-up layers 122, 123 are also arranged in the shape of pillars.

On the other hand, when the p-type pillar regions and the n-type pillar regions are viewed on a plan-view structure basis, the p-type epitaxial fill-up layers 122, 123 are arranged in the shape of stripes in the n-type epitaxial layer 120 constituting the n-type pillar regions. As a result, the n-type epitaxial layers 124 as the n-type pillar-shaped semiconductor regions each sandwiched between the p-type epitaxial fill-up layers 122, 123 are also arranged in the shape of stripes. Further, the p-type base regions 126, the n⁺ source regions, the source electrodes, and the gate electrodes are also formed in the shape of stripes extending in the same direction as the p-type epitaxial fill-up layers 122, 123. In the device portion 3, the pitch of the high-withstand-voltage structure of the super junction structure (the repetition pitch of the p-type epitaxial fill-up layers 122, 123) is ordinarily on the order of ten and a few micrometers to a few tens of micrometers. Therefore, in this embodiment, the pitch of the FET gates as switches is also adjusted to the pitch of the super junction structure.

With such a structure, the semiconductor device 1A constitutes an electron implantation n-channel MOSFET in which a surface portion of the p-type base region 126 just beneath the gate insulating film serves as a channel region. Specifically, in the layout shown in FIG. 2A, the trenches and the p-type silicon epitaxial layers (p-type epitaxial fill-up layers 122, 123) formed by filling up the trenches, which constitute the super junction structure, are in a stripe layout in which they are extended in the Y-direction in the figure and are arrayed in parallel. In this case, paying attention to the terminal portion 5 in the periphery of the device portion 3, the striped patterns are characterized in that the extension thereof in the longitudinal direction (Y-direction) ranges not only through the device portion 3 (device body) but also into the terminal portion 5 and that, in the X-direction also, they are arrayed in the terminal portion 5 at substantially the same pitch and in substantially the same size (width and depth) as in the device portion 3. The "width" is the width in the direction (X-direction) in which the p-type epitaxial fill-up layers 122, 123 and the n-type epitaxial layers 124 at the same depth position appear alternately. The expression "substantially the same" means that there may be a difference of a few percent (for example, up to 5%). Incidentally, while the trenches 121 for forming the p-type epitaxial fill-up layers 122 and the p-type epitaxial fill-up layers 123 are repeated with substantially the same trench width and at substantially the same trench interval (array pitch) here, this is not indispensable. It is to be noted, however, that when these factors are substantially the same, the device can be formed uniformly, and the configuration contributes also to enhancing the withstand voltage in the terminal portion 5.

Besides, in order to stabilizing characteristics through further enhancement of the withstand voltage in the terminal portion 5, the semiconductor device 1A is combined with a lateral RESURF structure which functions as a p-type depletion layer extension layer (depletion layer extension region). Specifically, in the terminal portion 5, a p-type lateral RESURF region 130 of a predetermined impurity concentration is provided which is formed in the terminal portion 5 so as to surround the device portion 3 and in the state of being connected to the p-type base region 126 at the boundary with the device portion 3. Only in the terminal portion 5 in the periphery of the device portion 3, the p-type lateral RESURF region 130 (p-type semiconductor region) functioning as a depletion layer extension region is provided at a surface portion on the source electrode surface side of the n-type epitaxial layer 120, in such a manner as to orthogonally intersect the p-type epitaxial fill-up layers 123 (P-type pillar regions) and the n-type epitaxial layers 124 (n-type pillar regions), in other words, in parallel to the drain electrode surface and the source electrode surface. With the p-type lateral RESURF region 130 thus provided, the electric field at the OFF time is moderated by the function of the depletion layer extension region, so that stable enhancement of withstand voltage can be promised.

Although the p-type epitaxial fill-up layers 123 (or the p-type pillar regions) constitute a vertical RESURF, its combination with the lateral RESURF having the depletion layer extending function makes it possible to obtain a further enhanced withstand voltage. It is to be noted here, however, that the demerits (lowering in withstand voltage, worsening of electric field balance, or the like) arising from an increase in impurity concentration in the areas where both the p-type epitaxial fill-up layer 123 and the p-type lateral RESURF region 130 are formed should be taken into consideration. Specifically, in the areas where the p-type pillar region and the p-type lateral RESURF region overlap, the impurity would be more introduced, to result in an excessively doped (higher-concentration) p type. Consequently, the depleting conditions would not be satisfied, as in the case of a semiconductor device 1Z_1 according to a third comparative example (Part 1) shown in FIGS. 2C and 2D, and, in practice, the expected enhancement of withstand voltage would not be obtainable.

As a measure to solve this problem, in forming the lateral RESURF region, the overlapping of the lateral RESURF region with the p-type pillar is restrained so as to achieve depletion at main locations in the terminal portion 5. In the semiconductor device 1A according to the first embodiment, the p-type RESURF region is selectively formed at the surface of each of separation portions (portions of the n-type epitaxial layer 124) of the stripes (p-type epitaxial fill-up layers 123) in such a manner as to avoid the p-type epitaxial fill-up layers 123 and to be substantially continuous with the p-type epitaxial fill-up layers 123. In view of facilitating the manufacture of the device, all the trenches 121, whether provided in the device portion 3 (cell portion) or in the terminal portion 5, are preferably set to be the same in width, pitch, and depth. It is preferable that the impurity concentration in the n-type epitaxial layer 124 in the device portion 3 be the same as in the terminal portion 5, and that the impurity concentration in the p-type epitaxial fill-up layers 122 and 123 in the device portion 3 be the same as in the terminal portion 5. When these are simply adopted as limitative conditions, it may be impossible to take a margin for a sufficiently high withstand voltage in the terminal portion 5. In order to cope with this withstand voltage-related problem, a combination of these conditions with a RESURF region may be contemplated. A simple combination with the RESURF region, however, a harmful influence would arise from the overlapping of the RESURF region with the p-type epitaxial fill-up layer 123. Taking this into account, in this embodiment of the invention, a pattern such that the P-type trench and the p-RESURF would not overlap with each other is devised, whereby the withstand voltage margin in the present process is secured on a mechanism basis.

The expression "in such a manner as to avoid the p-type epitaxial fill-up layers 123 and to be substantially continuous with the p-type epitaxial fill-up layers 123" means a manner such that the p-type epitaxial fill-up layers 123 each lack the p-type lateral RESURF region 130 at least at a part of the surface portion thereof, in other words, a manner such that the overlap between the p-type epitaxial fill-up layer 123 and the p-type lateral RESURF region 130 is lessened. The gist of this description resides in that the p-type lateral RESURF regions are selectively provided in the vicinity of the surfaces of the n-type epitaxial layer 120 (n-type epitaxial layers 124) in such a manner as to avoid, as much as possible, overlap with the p-type epitaxial fill-up layers 123, in the terminal portion 5.

Although it is optimal that the p-type epitaxial fill-up layer 123 and the p-type lateral RESURF region 130 are substantially continuous with each other in the state of not overlapping with each other at all, some degree of overlapping is allowable, since the gist of the above contrivance is that the p-type epitaxial fill-up layer 123 is restrained as much as possible from being covered by the p-type lateral RESURF region 130. The expression "substantially continuous with" means that, in a plane condition, the layer and the region are continuous with each other in such a manner that the depletion layer spreads laterally, due to the presence of the p-type lateral RESURF region 130 which is a p-type semiconductor region extending laterally. It may suffice that, in plan view, the area of the region where the p-type lateral RESURF region 130 is absent over the p-type epitaxial fill-up layer 123 is less than the area of the overlap portion where the p-type lateral RESURF region 130 is present over the p-type epitaxial fill-up layer 123. For example, it may suffice to dispose the p-type lateral RESURF region 130 of an appropriate area between the separated portions of the p-type epitaxial fill-up layers 123; in this case, the p-type epitaxial fill-up layer 123 and the p-type lateral RESURF region 130 may partly overlap with each other to some extent.

Incidentally, each of the p-type epitaxial fill-up layers 123 in the terminal portion 5 is not set in an electrically floating condition but set in such a condition that at least a part thereof can make electrical connection with the p-type lateral RESURF region 130. The p-type lateral RESURF region 130 is, for example, connected to the p-type base region 126 in a boundary portion of the device portion 3 at the boundary with the terminal portion 5 so that it can make electrical connection with the source electrode. Due to the presence of the p-type lateral RESURF regions 130 (depletion layer extension regions) in the terminal portion 5, the p-type pillar regions (p-type epitaxial fill-up layers 123) are electrically connected. This results in that positive-hole currents generated at the time of breakdown of a surge voltage generated on a switching operation at an inductive load, the time of avalanche breakdown, or the time of recovery delay of a reverse-direction diode are transmitted easily, so that these kinds of withstand voltages are improved.

Incidentally, arrangement of the p-type lateral RESURF region 130 in every one of the spaces between all the p-type epitaxial fill-up layers 123 is not indispensable. Also, electrical connection of all the p-type epitaxial fill-up layers 123 with the p-type RESURF region 130 is not indispensable. Specifically, the p-type epitaxial fill-up layers 123 on the device peripheral side may be left in a floating condition. The point lies in that the p-type epitaxial fill-up layer 123 on the outermost peripheral side is electrically separated from the p-type epitaxial fill-up layers 123 in the inside.

In the device peripheral portion, defects such as fabrication failures (for example, etching cracks) are more liable to occur than in the inside portion. If the p-type epitaxial fill-up layer 123 at the device periphery is in electrical connection with the p-type epitaxial fill-up layer 123 in the inside portion, fabrication failure at the device periphery may lead to electrical connection of the p-type epitaxial fill-up layers 123 with other member. Where the outermost peripheral side is electrically separated from the inside portion, however, this problem is solved.

In addition, in the device peripheral portion, not only fabrication failures are liable to occur, but also there is a problem that at the times of forming trenches and filling up the trenches by epitaxial growth, the trench formation and the epitaxial growth in the inside portion and those in the peripheral portion may differ, due to differences of the peripheral environments from the inside, whereby differences in characteristics may result. If the peripheral components with such differences in characteristics are all electrically connected integrally to the inside components, the good characteristics on the inside cannot be made most of. This problem, however, is solved by the electrical separation of the outermost peripheral side from the inside.

For instance, as a first mechanism (setup), while the p-type lateral RESURF regions 130 are arranged in the terminal portion 5, the whole body of each of the p-type lateral RESURF regions 130 is disposed outside the regions of the p-type epitaxial fill-up layers 123. As a result, all the surface portions of the p-type epitaxial fill-up layers 123 lack the p-type lateral RESURF region 130, so that an optimum form free of the above-mentioned overlap at all is obtained. It suffices to arrange the p-type lateral RESURF regions 130 between the separated portions of the p-type epitaxial fill-up layers 123. Thus, it is unnecessary for substantially the whole surface of the terminal portion 5 (exclusive of the portions of the p-type epitaxial fill-up layers 123) to be covered by the p-type lateral RESURF region 130.

Where the trench forming pattern is laid out at substantially the same size (width and depth) and at substantially the same pitch as shown in FIGS. 2A and 2B, patterning of the p-type lateral RESURF regions 130 can also be realized by adopting a layout with substantially the same size and substantially the same pitch. Thus, although the application of the horizontal RESURF is inevitably accompanied by an increase in the number of process steps, priority is given to the realization of stable enhancement of withstand voltage by forming the p-type lateral RESURF regions 130 while avoiding the mutual overlapping of the p-type layers.

Here, the p-type epitaxial fill-up layers 122 and 123 are formed by the third fabrication method. Specifically, the p-type epitaxial fill-up layers 122 and 123 (striped pillar regions of the second conductivity type) are formed in substantially the same size (width, depth) and at substantially the same pitch in a fixed direction throughout the device, and they are fabricated by formation of trenches 121 and epitaxial growth of a p-type (second conductivity type) semiconductor. In this case, the p-type epitaxial fill-up layers 122 and 123 are formed to have a width of not more than 3 μm and an aspect ratio of not less than 12. Incidentally, the lower limit of the width is not 0 μm, and it depends on the withstand voltage Vb and the impurity concentrations C in the p-type epitaxial fill-up layers 122, 123 and the n-type epitaxial layer 124, with an exemplary value being about 1 μm. As for the technology for "digging" the trenches with a high aspect ratio of not less than 12, the digging can be realized by progress of, for example, ICP (Inductively Coupled Plasma) etching or RIE (Reactive Ion Etching). Alternatively, a special fabrication process, for example, anisotropic etching or silicon deep etching technology such as LIGA (Lithographie Galvanoformung Abformung) process may be adopted.

Thus, the semiconductor device 1A according to the first embodiment is a device in which the p-type epitaxial fill-up layers 122 (semiconductor P regions) and the n-type epitaxial layer 124 (semiconductor N regions) are alternately arranged repeatedly and in which thorough depletion occurs at the time of a reverse bias. In the device, the n-type epitaxial layer 124 (first conductivity type pillar regions) is integrally formed so as to cover the whole surface of the substrate, and the p-type epitaxial fill-up layers 122 (second conductivity type pillar regions) in the device portion 3 are formed by repetition of stripe-formed trenches. In addition, in the terminal portion 5 (peripheral region) surrounding the device portion 3, the p-type epitaxial fill-up layers 123 which are the same as the p-type epitaxial fill-up layers 122 in extending direction and layout relationship are formed.

Specifically, the p-type epitaxial fill-up layers 123 are extended in the same direction as the extending direction of the stripes of the p-type epitaxial fill-up layers 122, and are laid out at intervals in the repetition direction of the stripes. In forming such a structure, the n-type regions (n-type epitaxial layers 124) are formed by the n-type epitaxial substrate (n-type epitaxial layer 120) of the first conductivity type, whereas the P regions (p-type epitaxial fill-up layers 122, 123) are formed by forming trenches in the n-type epitaxial layer 120 and thereafter filling up the trenches with a p-type semiconductor by epitaxial growth. In this case, the trench width and the crystal plane orientation at the trench apertures are set to be constant.

By adopting the above-mentioned fabrication method and configuration, in forming the trenches and forming the p-type epitaxial fill-up layers 122 and 123, substantially the same crystal plane orientation and substantially the same trench aperture area ratio can be realized in the chip (namely, in the device portion 3) and throughout the wafer (namely, into the terminal portion 5), without causing a variety of silicon substrate crystal plane orientations to appear. This makes it possible to obtain a stable super junction structure upon fabrication. Besides, investigations for pattern optimization are facilitated, and pattern designing is simplified as it does not depend on individual specifications. Since the terminal portion 5 is formed with the same structure as that of the device portion 3, the semiconductor device 1A can be manufactured through an inexpensive manufacturing steps, without an increase in the number of steps. Further, where the stripe-form layout of the p-type epitaxial fill-up layers 123 is extended beyond the semiconductor device 1A to the whole area of the wafer, and when the p-type epitaxial fill-up layer 123 at the device peripheral edge (at the outermost peripheral portion of the terminal portion 5 in the semiconductor device 1A) is utilized as a channel stop, it becomes unnecessary to separately form a channel stop (omission of such a channel stop is enabled).

Here, for example, a structure may be contemplated in which, as shown in FIG. 2E, the trenches for forming the p-type epitaxial fill-up layers 123 in the terminal portion 5 are set to be narrower than the trenches for forming the p-type epitaxial fill-up layers 122 in the device portion 3. Namely, a structure may be contemplated in which, as indicated by arrow (a), the trench aperture size (width) in the terminal portion 5 is set narrower than the trench aperture size (width) in the device portion 3. If the trench aperture size (width) is thus narrow, in general, the etching depth would be small, and the size of the p-type epitaxial fill-up layer 122 in the depth direction would be instable.

On the contrary, a structure may be contemplated in which the trenches for forming the p-type epitaxial fill-up layers 123 in the terminal portion 5 is set to be wider than the trenches for forming the p-type epitaxial fill-up layers 122 in the device portion 3. Namely, a structure may be contemplated in which, as indicated by arrow (b), the trench aperture size (width) in the terminal portion 5 is set wider than the trench aperture size (width) in the device portion 3. If the trench aperture size (width) is too wide, i.e., if the aspect ratio (depth/width) is too low, it may be impossible to fill up the trenches by epitaxial growth at the time of subsequent formation of the p-type epitaxial fill-up layers 123.

Besides, though not shown in the drawing, if the direction of the trenches for forming the p-type epitaxial fill-up layers 123 in the terminal portion 5 is set different from (for example, set perpendicular to) the direction of the trenches for forming the p-type epitaxial fill-up layers 122 in the device portion 3, an influence of the crystal plane orientation of the substrate (n-type high-concentration substrate 110) would be produced. Specifically, it may become impossible to fill up the trenches by epitaxial growth at the time of subsequent formation of the p-type epitaxial fill-up layers 123, or problems such as abnormal growth may be brought about.

In contrast, in the semiconductor device 1A according to the first embodiment, the p-type epitaxial fill-up layers 122 and 123 are formed to have a width of not more than 3 μm and an aspect ratio of not less than 12, whereby the just-mentioned problems are solved, and the characteristics of the terminal portion 5 will be stable, with the result that an enhanced withstand voltage can be promised in the terminal portion 5. This is attributable to the fact that the etching shape at the time of forming the trenches is kept constant because the crystal plane orientation and the shape (rectangular stripes having a longitudinal direction) are fixed, and the fact that the epitaxial growth conditions at the time of filling up the trenches with the p-type semiconductor by epitaxial growth are kept stably because the crystal plane orientation and the shape are constant.

In addition, in the semiconductor device 1A according to the present embodiment, the p-type lateral RESURF regions 130 are selectively formed at the separation portions (the surfaces of the n-type epitaxial layers 124) repeated in the direction perpendicular to the extending direction of the stripes (the p-type epitaxial fill-up layers 123), so as to obviate the overlapping between the p-type epitaxial fill-up layer 123 and the p-type lateral RESURF region 130. Therefore, the regions of a raised impurity concentration where the p-type RESURF region and the p-type repeated peripheral fill-up epitaxial pattern overlap with each other are lessened, and depletion can be properly obtained at main locations in the terminal portion 5. Securing a high withstand voltage in the terminal portion 5 is realized while stabilizing the potential of the single floating p-type fill-up layer (the p-type epitaxial fill-up layer 123) and improving the recovery characteristics of the reverse-direction diode. In the terminal portion 5 of the semiconductor device 1A, a structure free of concentration of electric field at the time when a voltage is impressed is realized, with the result that the ON-state resistance can be reduced by raising the impurity concentration in all the N regions (the n-type epitaxial layer 120, the n-type epitaxial layers 124). Moreover, the pattern of the p-type lateral RESURF regions 130 can be formed in a reversing manner from the pattern of the p-type fill-up layers (the p-type epitaxial fill-up layers 123) in the terminal portion 5, so that the pattern arrangement is easy to carry out.

Thus, a device is obtained which has a peripheral region with a super junction structure based on trenches and p-type epitaxial fill-up structure. In addition, in response to a recovery delay of the reverse-direction diode caused by the peripheral floating structure for securing a high withstand voltage, transfer of potential is facilitated and improved by the RESURF structure. For example, the withstand level of the surge voltage generated upon a switching operation under an inductive load and the avalanche breakdown voltage are improved. Moreover, investigations for pattern optimization are facilitated, the pattern designing is simplified as it does not depend on individual specifications, and a semiconductor device 1A with a high withstand voltage can be obtained through easy process designing.

Incidentally, in relation to the mechanism of restraining the overlap between the p-type epitaxial fill-up layer 123 and the p-type lateral RESURF region 130, the configuration in which the p-type epitaxial fill-up layers 123 are in the shape of stripes is not indispensable. The plan-view shape of each p-type epitaxial fill-up layer 123 is an arbitrary shape such as quadrilateral (square, rhombus, rectangle) or other polygons, or circle (inclusive of ellipse). This is applicable also to a structure in which p-type epitaxial fill-up layers 123 of an arbitrary shape are arranged appropriately (for example, in a grid pattern). In this case, the periphery of the p-type epitaxial fill-up layer 123 is surrounded by the n-type epitaxial layer 124. In the device portion 3, whether the p-type epitaxial fill-up layers are in the shape of stripes or those having an arbitrary shape are arrayed can be determined arbitrarily; however, it is preferable to set the shape of the p-type epitaxial fill-up layers in the device portion 3 to be the same as that in the terminal portion 5. This is because, where the same form (substantially the same depth, shape, and pitch) is adopted in forming the trenches throughout the device (the device portion 3 and the terminal portion 5), the structure of predetermined shape pillars formed by formation of trenches and epitaxial growth and the structure of peripheral high-withstand-voltage regions can be fabricated stably.

Second Embodiment

FIGS. 3A to 3F illustrate a semiconductor device 1B according to a second embodiment of the present invention. Here, FIGS. 3A to 3D show schematically the configuration of the semiconductor device 1B of the second embodiment. FIGS. 3A and 3C are XY plan views of the semiconductor device 1B, whereas FIGS. 3B and 3D are XZ sectional views taken along line A-A' of FIGS. 3A and 3C, respectively. FIGS. 3E and 3F illustrate a bad influence produced in the case where a lateral RESURF structure is applied to a super junction structure in the second embodiment.

The semiconductor device 1B in the second embodiment is a device in which the mechanism (setup) of the first embodiment is basically applied, and some modifications are made in the p-type epitaxial fill-up layers 123 in the terminal portion 5. The basic thought of the modifications is that of the p-type epitaxial fill-up layers 123 in the terminal portion 5, each of the portions extending from the device portion 3 in the longitudinal direction of the stripes is structurally separated at least at one part thereof. Those portions extended from the p-type epitaxial fill-up layers 122 of the device portion 3 are arranged in the state of being structurally separated in the extending direction, and the n-type epitaxial layer 124 is disposed between the separated portions. Paying attention to the terminal portion 5, the structure is characterized in that the extension in the longitudinal direction (Y-direction) of the stripes is once interrupted in the device portion 3 (device body) and the terminal portion 5 (peripheral structure portion), and then the extension is made in the Y-direction at substantially the same pitch and width. The structure is also characterized in that, also in the X-direction perpendicular to the longitudinal direction (Y-direction) the p-type epitaxial fill-up layers are arrayed in parallel at substantially the same pitch and width as those in the device portion 3. The XZ sectional view taken along line A-A' is the same as that in the first embodiment. While the p-type lateral RESURF regions 130 are not formed in the array direction of the stripes at the portions extended from the device portion 3, the p-type lateral RESURF regions 130 may be arranged in the same manner as in the first embodiment.

The distance between the separated portions in the extending direction may be determined appropriately, and may be different from the width or array pitch of the p-type epitaxial fill-up layers 122, 123. For the separated portions in the extending direction, also, the p-type RESURF regions (p-type lateral RESURF regions 130) are selectively formed, in the same manner as for the separated portions in the direction in which the stripes are arrayed repeatedly. Formation of the p-type RESURF regions at the separation portions has the merit that the overlap between the p-type RESURF region and the p-type epitaxial fill-up layer 123 is lessened. For distinction from the p-type lateral RESURF regions 130 arranged between the p-type epitaxial fill-up layers 123 in the X-direction perpendicular to the longitudinal direction (Y-direction), the p-type RESURF regions arranged in the separation portions in the longitudinal direction of the stripes are made to be p-type lateral RESURF regions 130_2. This applies also to those ones of the other embodiments described later which have the same structure as the just-mentioned.

In the semiconductor device 1B of the second embodiment, also, the p-type lateral RESURF regions 130 having the depletion layer extending function are arranged in the terminal portion 5. In this case, as above-described in the first embodiment, the regions where the p-type pillar region and the p-type lateral RESURF region overlap with each other are of excessively doped (high-concentration) p type due to introduction of more impurity, leading to the condition where the depletion conditions are not satisfied and the expected enhanced withstand voltage cannot be obtained in practice, like in the semiconductor device 1Z_2 in a third comparative example (Part 2) shown in FIGS. 3E and 3F. In order to solve this problem, the p-type RESURF regions (p-type lateral RESURF regions 130) are selectively formed so as to avoid the p-type epitaxial fill-up layers 123 in the terminal portion 5. This point is the same in thought as the first embodiment in which the overlap with the p-type pillars is suppressed so as to attain depletion at main locations in the terminal portion 5. Thus, the same effect as in the first embodiment is obtained, as stable enhancement of withstand voltage is realized by forming the p-type lateral RESURF regions 130 while avoiding the overlapping between the p-type layers in the terminal portion 5.

Here, a semiconductor device 1B_1 in the second embodiment (first example) shown in FIGS. 3A and 3B has a configuration in which each of the p-type epitaxial fill-up layers 123 extended from the p-type epitaxial fill-up layers 122 is separated at one location in each extending direction. In this case, the separated portion is preferably set at the boundary between the device portion 3 and the terminal portion 5. The expression "one location in each extending direction" means that the separation of the p-type epitaxial fill-up layer 123 occurs at one direction, both between the device portion 3 and the device peripheral edge in the extending direction on one side and between the device portion 3 and the device peripheral edge in the extending direction on the opposite side. Though not shown in the drawing, the separation at one location may occur in only either one of the extending direction on one side and the extending direction on the opposite side. In other words, the status of separation may be asymmetric in the longitudinal direction of the stripes. With the structure shown in FIGS. 3A and 3B, a structure is obtained in which the length in the extending direction of the stripes necessary for securing a withstand voltage in the terminal portion 5 can be realized at a minimum value.

A semiconductor device 1B 2 according to the second embodiment (second example) shown in FIGS. 3C and 3D has a configuration in which each of the p-type epitaxial fill-up layers 123 extended from the p-type epitaxial fill-up layers 122 is separated at a plurality of locations in each extending direction. In other words, short stripe-form p-type epitaxial fill-up layers 123 are repeatedly arranged in plurality in the extending direction of the stripes. In this case, the first one of the separated portions is preferably set at the boundary between the device portion 3 and the terminal portion 5. The expression "a plurality of locations in each extending direction" means that separation of the p-type epitaxial fill-up layer 123 occurs at two or more locations, both between the device portion 3 and the device peripheral edge in the extending direction on one side and between the device portion 3 and the device peripheral edge in the extending direction on the opposite side. Though not shown in the drawing, the separation at a plurality of locations may occur in only either one of the extending direction on one side and the extending direction on the opposite side. In other words, the status of separation may be asymmetric in the longitudinal direction of the stripes. With the structure shown in FIGS. 3C and 3D, elongation of the depletion layer in the extending direction of the stripes can be varied, whereby concentration of electric field can be further suppressed, so that the withstand voltage in the terminal portion 5 can be further enhanced. As a result, the margin of the withstand voltage can be further enlarged.

In FIGS. 3C and 3D, while the length of the p-type epitaxial fill-up layer 123 in the terminal portion 5 in the array direction of the stripes is set shorter than the combined length (the total length inclusive of the separation portions) of the p-type epitaxial fill-up layer 122 in the device portion 3 and the p-type epitaxial fill-up layer 123 in the terminal portion 5 in the extending direction of the stripes, this configuration is not indispensable, and the two lengths may be the same. The setting of the shorter length is adopted based on the thought that the desired effect can be attained where end portions are located at roughly equal distances from the device portion 3 (cell portion). It is physically possible that the terminal structures of the p-type epitaxial fill-up layers 123 (filling-up of the trenches 121 by epitaxial growth) are located in the whole body, without adopting the shorter length. In this case, however, some side effects, for example, an increase in parasitic capacitance may possibly be produced.

Third Embodiment

FIGS. 4A to 4D illustrate a semiconductor device 1C according to a third embodiment of the present invention, showing schematically the configuration of the semiconductor device 1C of the third embodiment. FIGS. 4A and 4C are XY plan views of the semiconductor device 1C, and FIGS. 4B and 4D are XZ sectional views taken along line A-A' of FIGS. 4A and 4C, respectively.

The semiconductor device 1C according to the third embodiment is a device in which the mechanism (setup) of the first embodiment is basically applied to the structure of the p-type epitaxial fill-up layers 123, while some modifications are applied to the p-type lateral RESURF regions 130 in the terminal portion 5. The basic thought of the modifications is characterized by a second mechanism (setup) in which, in forming the p-type lateral RESURF regions 130, the p-type lateral RESURF regions 130 are arranged in the terminal portion 5, while an apertures 132 is formed at the p-type lateral RESURF regions 130 at least at a part of each of surface portions of the p-type epitaxial fill-up layers 123. The apertures 132 are provided at positions corresponding to the p-type epitaxial fill-up layers 123.

In short, in the periphery of the device portion 3, substantially the whole surface (exclusive of the portions of the p-type epitaxial fill-up layers 123) of the terminal portion 5 is covered with the p-type lateral RESURF region 130, or, generally speaking, the p-type epitaxial fill-up layer 123 and the p-type lateral RESURF regions 130 overlap with each other, and, in this case, the p-type lateral RESURF regions 130 at the surface portions of the p-type epitaxial fill-up layers 123 are provided with the apertures 132. Where the p-type lateral RESURF regions 130 at the surface portions of the p-type epitaxial fill-up layers 123 are provided with the apertures 132, overlap between the p-type lateral RESURF region 130 and the p-type epitaxial fill-up layer 123 does not occur in the areas of the apertures 132. In order to lessen (preferably, obviate) the overlap between the p-type lateral RESURF region 130 and the p-type epitaxial fill-up layer 123, it is preferable that the size (in this example, particularly, the width) of the aperture 132 is set to be larger than the size of the p-type epitaxial fill-up layer 123.

Here, the semiconductor device 1C_1 in the third embodiment (first example) shown in FIGS. 4A and 4B has a configuration in which the apertures 132 are formed on the basis of each of separation portions (portions of the n-type epitaxial layers 124) in the array direction of the p-type epitaxial fill-up layers 123, and the apertures 132 are also formed on the basis of each of the p-type epitaxial fill-up layers 123 extended from the p-type epitaxial fill-up layers 122. In this case, at the boundary portion between the device portion 3 and the terminal portion 5, the p-type lateral RESURF region 130 may be arranged as shown in the figures, or, though not shown, the aperture 132 in the device portion 3 may be continuous with the aperture 132 provided on the basis of the p-type epitaxial fill-up layer 123.

The semiconductor device 1C_2 in the third embodiment (second example) shown in FIGS. 4C and 4D has a configuration in which the apertures 132 are formed on the basis of each of separation portions (portions of the n-type epitaxial layers 124) in the array direction of the p-type epitaxial fill-up layers 123, whereas a single continuous aperture 132 is formed correspondingly to the p-type epitaxial fill-up layers 123 extended from the p-type epitaxial fill-up layers 122. In this case, at the boundary portion between the device portion 3 and the terminal portion 5, the p-type RESURF region 130 may be arranged as shown in the figures, or, though not shown, the aperture 132 in the device portion 3 may be continuous with the single aperture 132 provided correspondingly to the p-type epitaxial fill-up layers 123.

Incidentally, in the plan views shown in FIGS. 4A and 4C, the portion of overlap between the p-type epitaxial fill-up layer 123 and the p-type lateral RESURF region 130 is illustrated as if the p-type lateral RESURF 130 were on the lower side and the p-type epitaxial fill-up layer 123 were on the upper side. However, this is for convenience of drawing. In practice, the p-type lateral RESURF region 130 is on the upper side, and the p-type epitaxial fill-up layer 123 is on the lower side, and the impurity concentration is raised in the overlap portion.

In any of the above-mentioned configurations, the p-type RESURF regions (p-type lateral RESURF regions 130) are selectively formed so as to avoid the p-type epitaxial fill-up layers 123 in the terminal portion 5. This point is the same in thought as the first embodiment in which the overlap with the p-type pillars is suppressed so as to attain depletion at main locations in the terminal portion 5. Thus, the same effect as in the first embodiment is obtained, as stable enhancement of withstand voltage is realized by forming the p-type lateral RESURF regions 130 while avoiding the overlapping between the p-type layers in the terminal portion 5. It is to be noted here, however, that comparing the first example with the second example, the first example is larger in the area of the p-type lateral RESURF regions 130 and is advantageous in enhancement of withstand voltage, as compared with the second example.

Fourth Embodiment

FIGS. 5A to 5D illustrate a semiconductor device 1D according to a fourth embodiment of the present invention, showing schematically the configuration of the semiconductor device 1D of the fourth embodiment. FIGS. 5A and 5C are XY plan views of the semiconductor device 1D, and FIGS. 5B and 5D are XZ sectional views taken along line A-A' of FIGS. 5A and 5C, respectively.

In the semiconductor device 1D according to the fourth embodiment, the mechanism (setup) of the second embodiment is basically applied in regard of the structure of the p-type epitaxial fill-up layers 123, while the same modification as in the third embodiment is made with respect to the p-type lateral RESURF regions 130 in the terminal portion 5.

Here, the semiconductor device 1D_1 according to the fourth embodiment (first example) shown in FIGS. 5A and 5B has a structure which is the same as that of the second embodiment (first example) in that each of the p-type epitaxial fill-up layers 123 extended from the p-type epitaxial fill-up layers 122 is separated at one location, and which is the same as that of the third embodiment (first example) in that the p-type lateral RESURF region 130 is provided with the apertures 132 on the basis of each of the p-type epitaxial fill-up layers 123 extended from the p-type epitaxial fill-up layers 122.

The semiconductor device 1D_2 according to the fourth embodiment (second example) shown in FIGS. 5C and 5D is a device which has the same structure as that of the second embodiment (second example) in that each of the p-type epitaxial fill-up layers 123 extended from the p-type epitaxial fill-up layers 122 is separated at a plurality of locations, and which has the same structure as that of the third embodiment (second example) in that the p-type lateral RESURF region 130 is provided with a single aperture 132 correspondingly to the p-type epitaxial fill-up layers 123 extended from the p-type epitaxial fill-up layers 122. Particularly, for the p-type epitaxial fill-up layers 123 each separated at the plurality of locations, a single aperture 132 being continuous on the basis of the separation is formed in the p-type lateral RESURF region 130. As for the separation portions in the extending direction of the p-type epitaxial fill-up layers, the surface portions of the separation portions are continuously covered with a layer (extension layer) extended from the p-type lateral RESURF region 130.

Incidentally, in the plan views shown in FIGS. 5A and 5C, the portion of overlap between the p-type epitaxial fill-up layer 123 and the p-type lateral RESURF region 130 is illustrated as if the p-type lateral RESURF 130 were on the lower side and the p-type epitaxial fill-up layer 123 were on the upper side. However, this is for convenience of drawing. In practice, the p-type lateral RESURF region 130 is on the upper side, and the p-type epitaxial fill-up layer 123 is on the lower side, and the impurity concentration is raised in the overlap portion.

Though not shown in the drawings, the semiconductor device may be a device which has the same structure as that of the second embodiment (first example) in that each of the p-type epitaxial fill-up layers 123 extended from the p-type epitaxial fill-up layers 122 is separated at one location, and which has the same structure as that of the third embodiment (second example) in that the p-type lateral RESURF region 130 is provided with a single aperture 132 correspondingly to the p-type epitaxial fill-up layers 123 extended from the p-type epitaxial fill-up layers 122. Or, the semiconductor device may be a device which has the same structure as that of the second embodiment (second example) in that each of the p-type epitaxial fill-up layers 123 extended from the p-type epitaxial fill-up layers 122 is separated at a plurality of locations, and which has the same structure as the third embodiment (first example) in that the p-type lateral RESURF region 130 is provided with the apertures 132 on the basis of each of the p-type epitaxial fill-up layers 123 extended from the p-type epitaxial fill-up layers 122.

In any of the above-mentioned configurations, the p-type RESURF regions are selectively formed at respective portions of separation in the extending direction of the stripes and the repeated separation portions in the direction perpendicular to the extending direction of the stripes. The p-type RESURF regions (p-type lateral RESURF regions 130) are selectively formed so as to avoid the p-type epitaxial fill-up layers 123 in the terminal portion 5. This point is the same in thought as the first embodiment in which the overlap with the p-type pillars is suppressed so as to attain depletion at main locations in the terminal portion 5. Thus, the same effect as in the first embodiment is obtained, as stable enhancement of withstand voltage is realized by forming the p-type lateral RESURF regions 130 while avoiding the overlapping between the p-type layers in the terminal portion 5. It is to be noted here, however, that as described in the third embodiment above, the configuration in which the p-type lateral RESURF region 130 is provided with the apertures 132 on the basis of each of the p-type epitaxial fill-up layers 123 is larger in the area of the p-type lateral RESURF regions 130 and is advantageous in enhancement of withstand voltage.

Fifth Embodiment

Figure 6A:
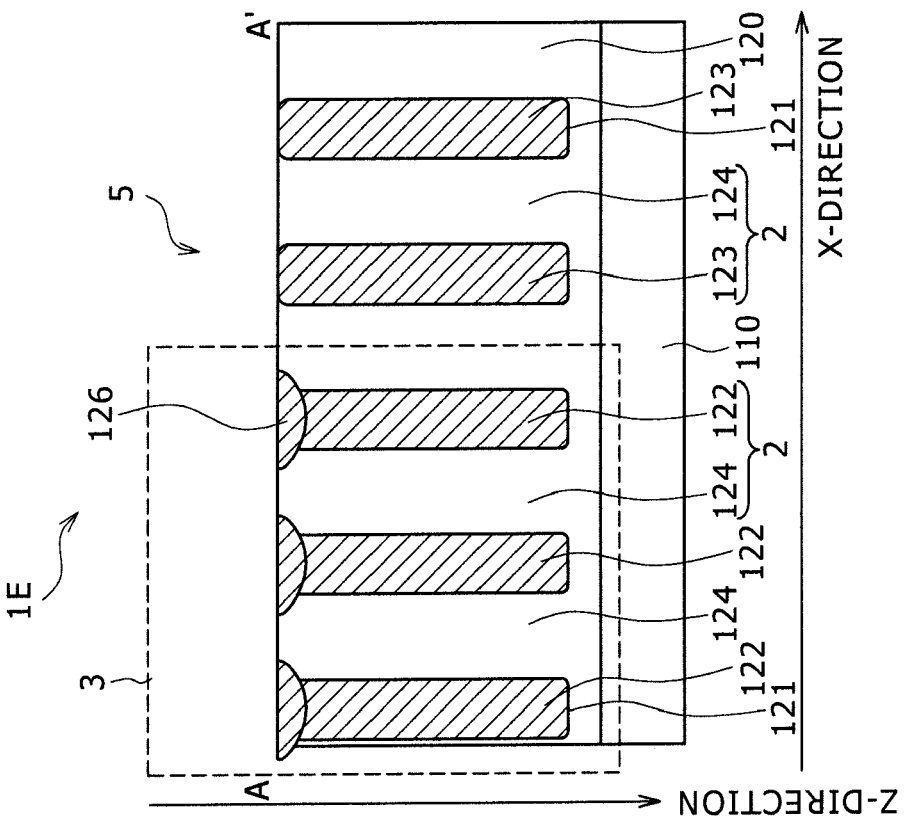
FIGS. 6A and 6B show schematically the configuration of a semiconductor device according to a fifth embodiment of the invention.
Figure 6B:
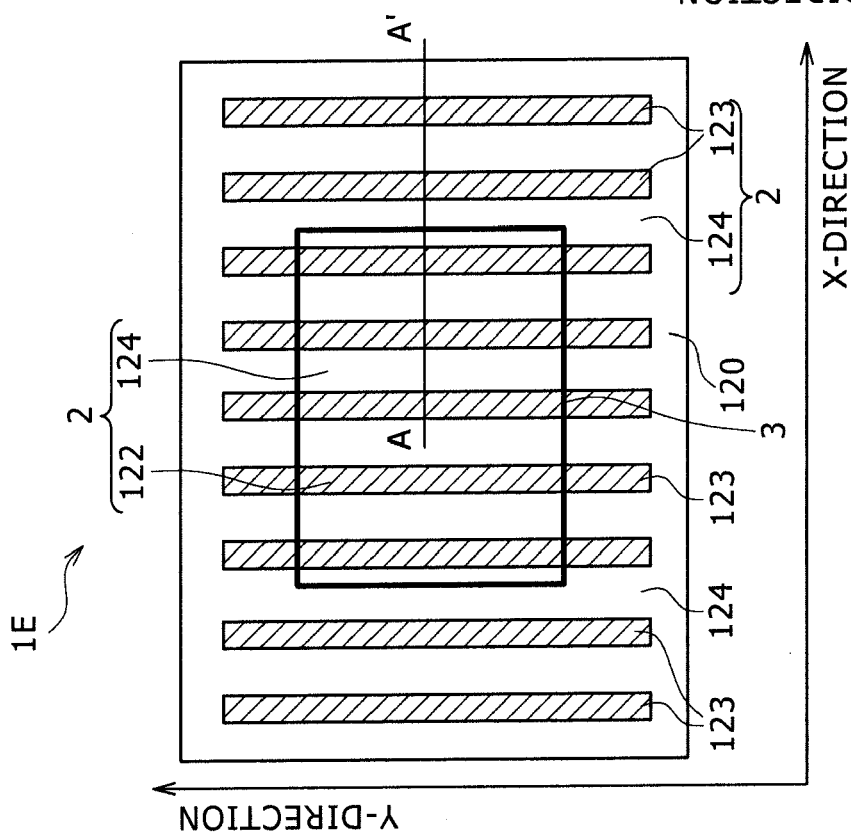

FIGS. 6A and 6B illustrate a semiconductor device 1E according to a fifth embodiment of the present invention, showing schematically the configuration of the semiconductor device 1E of the fifth embodiment. FIG. 6A is an XY plan view of the semiconductor device 1E, and FIG. 6B is an XZ sectional view taken along line A-A' of FIG. 6A.

The semiconductor device 1E of the fifth embodiment has a configuration in which the mechanism (setup) of the first embodiment is basically applied to the structure of the p-type epitaxial fill-up layers 123, while the p-type lateral RESURF regions 130 in the terminal portion 5 are removed.

In this configuration, the trenches constituting the super junction structure in the device portion 3 and the p-type epitaxial fill-up layers 122 formed by filling up the trenches are extended in the Y-direction in the figures and are arrayed in parallel. Further, paying attention to the terminal portion 5, the configuration is characterized in that the extension in the longitudinal direction (Y-direction) is made not only through the device portion 3 but also into the terminal portion 5, and that the p-type epitaxial fill-up layers 123 are not only extended in the longitudinal direction of the stripes but arrayed in parallel in the X-direction perpendicular to the longitudinal direction at substantially the same pitch and width as in the device portion 3. With this configuration, as has been described in the first embodiment above, in forming the trenches and epitaxially growing the p-type silicon, substantially the same crystal plane orientation and substantially the same trench aperture area ratio can be realized throughout the device of the device portion 3 and the terminal portion 5 (or, throughout the wafer), without causing a variety of silicon substrate crystal plane orientations to appear. This makes it possible to obtain a stable super junction structure upon fabrication. Besides, since the p-type lateral RESURF regions 130 are not provided, this configuration is advantageous in that the steps for forming the lateral RESURF regions are unnecessary and that the structure is inexpensive and good in affinity for the device structure process, though the configuration is inferior to the first embodiment in regard of withstand voltage.

Sixth Embodiment

FIGS. 7A and 7B illustrate a semiconductor device 1F according to a sixth embodiment of the present invention, showing schematically the configuration of the semiconductor device 1F of the sixth embodiment. FIG. 7A is an XY plan view for the sixth embodiment (first example), and FIG. 7B is an XY plan view for the sixth embodiment (second example).

The semiconductor device 1F of the sixth embodiment has a configuration in which the mechanism (setup) of the second embodiment is basically applied to the structure of the p-type epitaxial fill-up layers 123, while the p-type lateral RESURF regions 130 in the terminal portion 5 are removed. Here, the semiconductor device 1F_1 according to the sixth embodiment (first example) shown in FIG. 7A has a configuration obtained by removing the p-type lateral RESURF regions 130 from the semiconductor device 1B of the second embodiment (first example) in which each of the p-type epitaxial fill-up layers 123 extended from the p-type epitaxial fill-up layers 122 is separated at one location. The semiconductor device 1F_2 according to the sixth embodiment (second example) shown in FIG. 7B has a configuration obtained by removing the p-type lateral RESURF regions 130 from the semiconductor device 1B of the second embodiment (second example) in which each of the p-type epitaxial fill-up layers 123 extended from the p-type epitaxial fill-up layers 122 is separated at a plurality of locations.

As has been described in the second embodiment above, paying attention to the device portion 3, the structure is characterized in that the extension in the longitudinal direction (Y-direction) of the stripes is once interrupted in the device portion 3 (device body) and the terminal portion 5 (peripheral structure portion), and then the extension is made in the Y-direction at substantially the same pitch and width, and that also in the X-direction perpendicular to the longitudinal direction (Y-direction), the p-type epitaxial fill-up layers are arrayed in parallel at substantially the same pitch and width as those in the device portion 3. With this configuration, in forming the trenches and epitaxially growing the p-type silicon, substantially the same crystal plane orientation and substantially the same trench aperture area ratio can be realized throughout the device of the device portion 3 and the terminal portion 5 (or, throughout the wafer), without causing a variety of silicon substrate crystal plane orientations to appear. This makes it possible to obtain a stable super junction structure upon fabrication. Besides, since the p-type lateral RESURF regions 130 are not provided, this configuration is advantageous in that the steps for forming the lateral RESURF regions are unnecessary and that the structure is inexpensive and good in affinity for the device structure process, though the configuration is inferior to the second embodiment in regard of withstand voltage.

<Manufacturing Method>

Figure 8A:
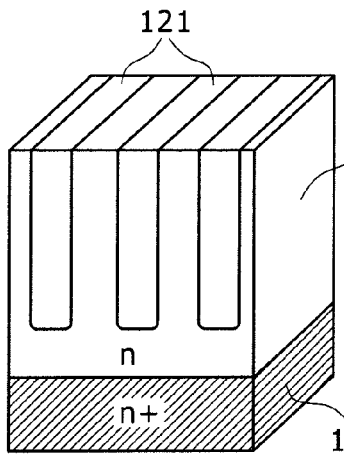
FIGS. 8A to 8H are views (Part 1) for illustrating techniques in a method of manufacturing a semiconductor device according to the first to fourth embodiments of the invention.

FIGS. 8A to 8N illustrate a technique in the method of manufacturing the semiconductor device according to this embodiment. The figures show respectively the device portion 3 (the portion at and around the center thereof) and the portions 3 and 5 (corresponding to A-A' sectional views in the embodiments) of the semiconductor devices 1A to 1D in the first to fourth embodiments. In the figures, FIGS. 8A, 8C, 8E, 8G, 8I, 8K, and 8M show a central portions of the device portion 3, while FIGS. 8B, 8D, 8F, 8H, 8J, 8L, and 8N show the portion ranging from the device portion 3 to the terminal portion 5 through the boundary portion therebetween. In some of the figures, the n-type high-concentration substrate 110 is omitted.

As has been described above, p-type epitaxial layers 122 and 123 are formed by applying the trench forming and epitaxially backfilling fabrication method (the third fabrication method) in which trenches are formed in a thick epitaxial layer (n-type epitaxial layer 120), and then the trenches once formed are backfilled with impurity-containing silicon by epitaxial growth. Each of the trench formation and the filling-up growth can be carried out in a single step. In this embodiment, the n-type epitaxial layer 120 is formed in a desired thickness in that area over an n-type high-concentration substrate 110 in which to form a device portion 3 and a terminal portion 5. Thereafter, trenches 121 in the same size, for both the device portion 3 and the terminal portion 5, are formed, whereby n-type epitaxial layers 124 are first formed between the adjacent ones of the trenches 121. Then, the trenches 121 in both the device portion 3 and the terminal portion 5 are filled up simultaneously (at a time) with a p-type semiconductor by epitaxial growth, to form p-type epitaxial fill-up layers 122 and 123.

Figure 8B:
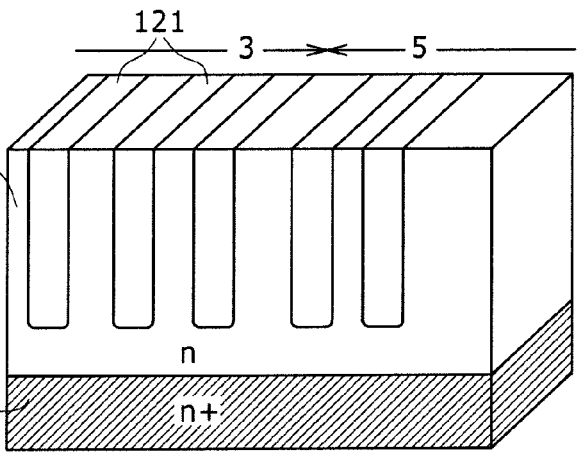

First, the n-type epitaxial layer 120 is formed over the n-type high-concentration substrate 110 serving as a drain layer. The impurity concentration in this instance is set at, for example, 5E14 to 1E16 ions/cm$^3$. Then, both in the device portion 3 and in the terminal portion 5, trench-shaped grooves (trenches 121) are formed in the n-type epitaxial layer 120 over the n-type high-concentration substrate 110, in an aspect ratio such as to satisfy the width W and the depth D of the p-type epitaxial fill-up layers 122 and 123 demanded finally, by an etching treatment in which a photoresist or an oxide film hard mask or the like is used (FIGS. 8A and 8B). In this instance, the trenches 121 for the p-type epitaxial fill-up layers 122 and 123 are formed in substantially the same size at substantially the same pitch and in a fixed direction throughout the whole region of the device (so that the width and repetition pitch of the trenches 121 are constant over the whole region). In addition, preferably, the trenches 121 are formed in such a trench width that the p-type epitaxial fill-up layers 122 and 123 will have a width of not more than 3 μm (and not less than 1 μm), and in such a depth that the aspect ratio is not less than 12.

Figure 8C:
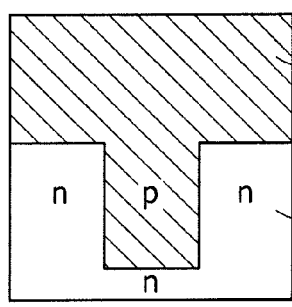
Figure 8D:
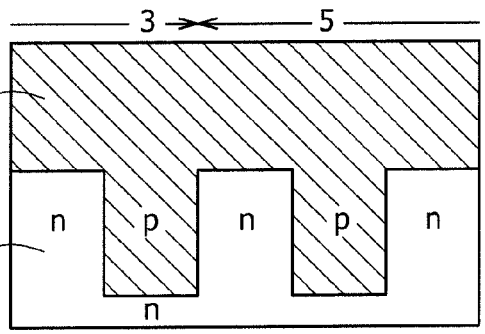
Figure 8E:
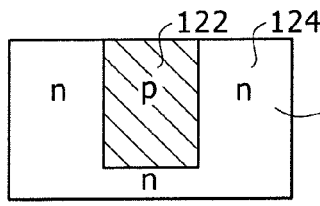
Figure 8F:
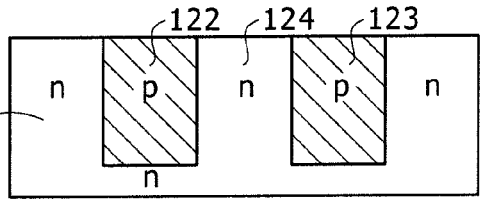

Thereafter, the trenches 121 are filled up with the p-type semiconductor by epitaxial growth, to form a super junction structure. For example, a p-type epitaxial fill-up layer 125 for later constituting the p-type epitaxial fill-up layers 122 and 123 is epitaxially grown in such a manner as to fill up the trenches 121 (FIGS. 8C and 8D). Further, after the trenches 121 are thus filled up with the p-type semiconductor for constituting the p-type epitaxial fill-up layers 122 and 123, the p-type epitaxial fill-up layer 125 is polished by a CMP (Chemical Mechanical Polishing) technique or the like until the n-type epitaxial layer 124 is exposed, and the resulting surface is mirror finished, to obtain the p-type epitaxial fill-up layer 122 and 123 with which the trenches 121 are filled up (FIGS. 8E and 8F).

As a result, the super junction structure is obtained in which in the n-type epitaxial layer 120 formed over the n-type high-concentration substrate 110, the p-type epitaxial fill-up layers 122, 123 and the n-type epitaxial layers 124 are repeatedly arranged alternately in substantially the same width and at substantially the same pitch. The n-type epitaxial layers 124 are composed of the n-type epitaxial layer 120 itself. The p-type epitaxial layers 122 and 123 are formed through the process in which the trenches 121 formed in the n-type epitaxial layer 120 are filled up with the p-type semiconductor, containing an impurity in a predetermined concentration, by epitaxial growth. The trenches 121 are formed in substantially the same size at substantially the same pitch and in a fixed direction throughout the whole region of the device. Therefore, the p-type epitaxial fill-up layers 122 and 123 formed by filling the trenches 121 with the p-type semiconductor by epitaxial growth are also formed in substantially the same size at substantially the same pitch and in the fixed direction throughout the whole region of the device.

Figure 8G:
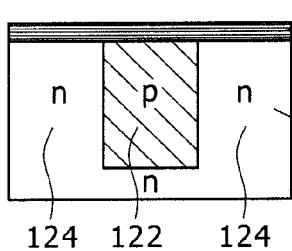
Figure 8H:
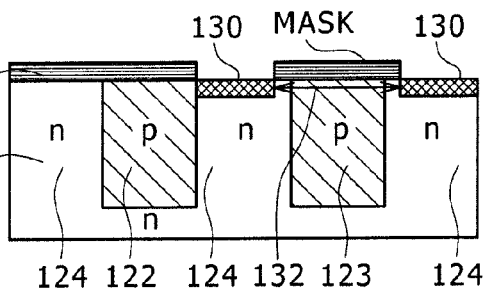

After the surface is mirror finished by the CMP technique or the like, a channel stopper 140 is formed at a surface portion of the n-type epitaxial layer 120 at the peripheral edge of the terminal portion 5. Further, on the side of the terminal portion 5, a p-type semiconductor containing an impurity in a predetermined concentration is implanted into the surfaces of the n-type epitaxial layers 124 (the n-type epitaxial layer 120) by using a mask so as to avoid the p-type epitaxial fill-up layers 123. Specifically, patterning is carried out by use of a photoresist mask or the like, and the p-type semiconductor having a predetermined impurity concentration for constituting p-type lateral RESURF regions 130, only in the terminal portion 5, is formed by ion implantation (FIGS. 8G and 8H). As a result, the p-type lateral RESURF regions 130 are selectively formed at separation portions of the stripes of the p-type epitaxial fill-up layer 123 (FIGS. 8I and 8J). Thus, the p-type lateral RESURF regions 130 covering the n-type epitaxial layer 120 is formed only in the terminal portion 5 and in such a manner that apertures 132 are formed, as required, in upper layers of the p-type epitaxial fill-up layers 123.

The patterning of the mask in this instance is so conducted that the mask at least covers the device portion 3 entirely and, on the terminal portion 5 side, covers at least a part of each of the p-type epitaxial fill-up layers 123. Preferably, the covering portion of the mask at a position corresponding to the p-type epitaxial fill-up layer 123 is set greater than the p-type epitaxial fill-up layer 123 in size (in this example, particularly, the width in the array direction of the stripes). In this preferable condition, the mask covers the p-type epitaxial fill-up layers 123 and also the apertures 132 surrounding the p-type epitaxial fill-up layers 123. With at least a part of each of the p-type epitaxial fill-up layers 123 thus covered by the mask, the aperture 132 is formed at the surface part of the p-type epitaxial fill-up layer 123, whereby the overlap between the p-type epitaxial fill-up layer 123 and the p-type lateral RESURF region 130 is lessened. When the mask is so formed as to cover areas which are larger than the p-type epitaxial fill-up layers 123 in size, the overlap is obviated.

Furthermore, on the device portion 3 side, as shown in FIGS. 8K and 8L, various elements of the MOSFET such as base region, gate insulating film, gate electrode, source region, source electrode, etc. are formed to complete the MOSFET having the super junction structure. For example, a p-type semiconductor containing an impurity in a predetermined concentration is implanted into the surfaces, on the opposite side from the n-type high-concentration substrate 110, of the p-type epitaxial fill-up layers 122 by masking for position matching to the p-type epitaxial fill-up layers 122, whereby the p-type base regions 126 are selectively formed so as to be connected to the p-type epitaxial fill-up layers 122.

Further, as shown in FIGS. 8M and 8N, $n^+$ source regions (source regions) are selectively formed at the surface portions of the p-type base regions 126. A source electrode (second main electrode) is formed so as to make contact with the surfaces of the $n^+$ source regions and the p-type base regions 126. An insulating film 142 is formed over the surface of the terminal portion 5 exclusive of a region over the p-type lateral RESURF region 130 (the p-type lateral RESURF region 130 at the boundary with the device portion 3). In addition, on the same surface side as the source electrode of the n-type epitaxial layer 120, gates (control electrodes) are each formed over the surfaces of the n-type epitaxial layers 124 sandwiched between adjacent p-type base regions 126 and the surfaces of the adjacent p-type base regions 126 and the $n^+$ source regions, through a gate insulating film therebetween, in the state of being surrounded by the source electrode. In this instance, the gate insulating film 144 is formed also over the insulating film 142 in the terminal portion 5. Besides, the source electrode 148 is formed so as to cover substantially the whole surfaces of the device portion 3 and the terminal portion 5. As a result, the p-type lateral RESURF regions 130 are electrically connected to the source electrode 146 through the p-type base region 126.

The methods of manufacturing the semiconductor devices 1E and 1F according to the fifth and sixth embodiments in which the p-type lateral RESURF regions 130 are not provided are not shown in the drawings, but the methods are realized by omitting the steps of forming the p-type lateral RESURF regions 130 from the above-described manufacturing method.

While the present invention has been described referring to the embodiments above, the technical scope of the invention is not limited to the scope of the description of the embodiments. Various modifications or improvements can be applied to the above embodiments without departure from the scope of the gist of the invention, and the configurations obtained through such modifications or improvements are also included in the technical scope of the invention.

In addition, the above-described embodiments are not to limit the inventions according to the appended claims, and all the combinations of the characteristic features described in the embodiments are not necessarily essential to the solving means according to the present invention. The above-described embodiments include various stages of the invention, and various inventions can be extracted by appropriate combinations of the plurality of constituent features disclosed. Also, when some constituent features are removed from all the constituent features shown in the embodiments, the configurations obtained upon removal of the some constituent features can be extracted as inventions, provided that the effect of the present invention is obtained.

For instance, while the bottom surfaces of the p-type epitaxial fill-up layers 122, 123 (or the trenches 121) do not reach the n-type high-concentration substrate 110 in the above embodiments, a configuration in which the bottom surfaces reach the n-type high-concentration substrate 110 may be adopted.

While the semiconductor regions with which the trenches 121 are filled up are p-type semiconductor regions in the above embodiments, these regions may be n-type semiconductor regions. Specifically, a structure may be adopted in which trenches 121 are formed in a p-type single crystal semiconductor layer arranged over an n-type high-concentration substrate 110, and the trenches 121 are each filled up with an n-type epitaxial layer.

While an n-type semiconductor substrate (n-type high-concentration substrate 110) is used in the above embodiments, a p-type semiconductor substrate may also be used. In that case, the following two kinds of super junction structure are applicable. One is a structure in which trenches 121 are formed in a p-type single crystal semiconductor layer arranged over a p-type semiconductor substrate, and the trenches 121 are each filled up with an n-type epitaxial layer. The other is a structure in which trenches 121 are formed in an n-type single crystal semiconductor layer arranged over a p-type semiconductor substrate, and the trenches 121 are each filled up with a p-type epitaxial layer.

While the MOSFET as an example of a switching device arranged over the super junction structure has been shown through combination with a lateral MOSFET having a silicon surface as channel, this is not limitative of the invention. A vertical MOSFET having a gate oxide and a gate metal formed at inside walls of comparatively shallow trenches may also be adopted.

While the MOS type in which the gate insulating film includes a silicon oxide film is adopted in the above embodiments, this is not limitative of the invention. A MIS (Metal Insulator Semiconductor) type in which the gate insulating film includes an insulating film (e.g., a high dielectric film) other than the silicon oxide film may be adopted.

While a power MOSFET (insulated gate field effect transistor) has been shown as an example in the above embodiments, the embodiments are applicable to any semiconductor device that permits application of a super junction structure. For example, the embodiments are applicable also to semiconductor devices designed to realize both an enhanced withstand voltage and an increased current capacity, such as IGBT (Insulated Gate Bipolar Transistor), SBD (Schottky Barrier Diode), and ordinary bipolar transistors and diodes.

While semiconductor devices in which silicon (Si) is used as the semiconductor material have been shown in the above embodiments, the material (base material) is not limited to silicon (Si). Examples of other materials than silicon (Si) which can be used include compound semiconductors such as silicon carbide (SiC), gallium nitride (GaN), aluminum nitride (AlN), etc., and diamond.

The present application contains subject matter related to that disclosed in Japanese Priority Patent Application JP 2008-205325 filed in the Japan Patent Office on Aug. 8, 2008, the entire content of which is hereby incorporated by reference.

What is claimed is:
1. A method of manufacturing a semiconductor device, comprising the steps of:

forming, over a first semiconductor region of a first conductivity type, a second semiconductor region of said first conductivity type;

forming, in said second semiconductor region in a device portion and a terminal portion surrounding said device portion, trenches in stripes in the same direction and in the same depth so as to form first pillar regions of said first conductivity type; and filling up said trenches with a semiconductor of said second conductivity type by epitaxial growth so as to form second pillar regions of said second conductivity type, and further wherein a RESURF region is selectively formed such that the RESURF region at most partially overlaps with the said second pillar regions and there are at least some surface portions of each of the second pillar regions where the RESURF region is not formed.

2. The method of manufacturing a semiconductor device according to claim 1, wherein said second semiconductor region is formed over said first semiconductor region, throughout the whole area in which to form said device portion and said terminal portion, said first pillar regions are each formed between adjacent ones of trenches formed in said second semiconductor region in stripes in the same direction and in the same depth in said device portion and said terminal portion, and said second pillar regions are formed by simultaneously filling up said trenches in said device portion and said terminal portion by epitaxial growth.

3. A method of manufacturing a semiconductor device, comprising the steps of:

forming, along a surface of a first semiconductor region of a first conductivity type, a second semiconductor region of said first conductivity type which has first pillar regions of said first conductivity type and second pillar regions of a second conductivity type, said first pillar regions and said second pillar regions being provided in paired state and alternately, in a device portion and a terminal portion surrounding said device portion; and forming a lateral RESURF (reduced surface field) region of said second conductivity type at a surface portion, on the opposite side from said first semiconductor region, of said second semiconductor region in said terminal portion by use of a mask for covering said device portion entirely and covering at least a part of each of said second pillar regions in said terminal portion, and further wherein the RESURF region is selectively formed such that the RESURF region at most partially overlaps with the said second pillar regions and there are at least some surface portions of each of the second pillar regions where the RESURF region is not formed.

4. The method of manufacturing a semiconductor device according to claim 3, wherein that part of said mask which covers each of said second pillar regions in said terminal portion is greater in size than said second pillar region.

5. The method of manufacturing a semiconductor device according to claim 3, wherein said second semiconductor region is formed over said first semiconductor region, throughout the whole area in which to form said device portion and said terminal portion, said first pillar regions are each formed between adjacent ones of trenches formed in said second semiconductor region in stripes in the same direction and in the same depth in said device portion and said terminal portion, and said second pillar regions are formed by simultaneously filling up said trenches in said device portion and said terminal portion by epitaxial growth.

6. A semiconductor device comprising:

a first semiconductor region of a first conductivity type disposed at a side of a first electrode;

a second semiconductor region having first pillar regions of said first conductivity type and second pillar regions of a second conductivity type, said first pillar regions and said second pillar regions being provided alternately, in a device portion and a terminal portion surrounding said device portion; and a lateral RESURF (reduced surface field) region of said second conductivity type disposed at a surface portion, on the opposite side from said first semiconductor region, of said second semiconductor region in said terminal portion, wherein each of respective surface portions of said second pillar regions in said terminal portion lacks said lateral RESURF region at least at a part thereof, and further wherein the RESURF region is selectively formed such that the RESURF region at most partially overlaps with the said second pillar regions and there are at least some surface portions of each of the second pillar regions where the RESURF region is not formed.

7. The semiconductor device according to claim 6, wherein said lateral RESURF region is provided, at a position corresponding to said second pillar region, with an aperture greater in size than said second pillar region.

8. The semiconductor device according to claim 6, wherein each of said second pillar regions is formed by filling up each of trenches, formed in said second semiconductor region, with a semiconductor of said second conductivity type by epitaxial growth;

each of said first pillar regions is composed of a region sandwiched between said second pillar regions; and said second pillar regions are arrayed in stripes in the same direction and in the same depth throughout the whole area of said device portion and said terminal portion in said second semiconductor region, and their width in the array direction and their array pitch are the same at the same depth position in said device portion and said terminal portion.

9. The semiconductor device according to claim 8, wherein that or those of said second pillar regions which are located in said terminal portion extended from said device portion in a longitudinal direction of said stripes are each structurally separated at least at one part thereof; and said lateral RESURF region is present continuously in relation to said separated part of each said stripe.

10. The semiconductor device according to claim 6, wherein said respective first pillar regions in said device portion and in said terminal portion are so formed as to be the same in impurity concentration; and said respective second pillar regions in said device portion and in said terminal portion are so formed as to be the same in impurity concentration.

11. A semiconductor device comprising:

a first semiconductor region of a first conductivity type disposed on the side of a first electrode; and a second semiconductor region having first pillar regions of said first conductivity type and second pillar regions of a second conductivity type, said first pillar regions and said second pillar regions being provided in paired state and alternately, in a device portion and a terminal portion surrounding said device portion, along a surface on the side of a second electrode disposed on the opposite side of said first semiconductor region from said first electrode, wherein each of said second pillar regions is formed by filling up each of trenches, formed in said second semiconductor region, with a semiconductor of said second conductivity type by epitaxial growth, each of said first pillar regions is composed of a region sandwiched between said second pillar regions, and said second pillar regions are arrayed in stripes in the same direction and in the same depth throughout the whole area of said device portion and said terminal portion in said second semiconductor region, and their width in the array direction and their array pitch are the same at the same depth position in said device portion and said terminal portion, and further wherein a RESURF region is selectively formed such that the RESURF region at most partially overlaps with the said second pillar regions and there are at least some surface portions of each of the second pillar regions where the RESURF region is not formed.

12. The semiconductor device according to claim 11,
wherein that or those of said second pillar regions which are located in said terminal portion extended from said device portion in a longitudinal direction of said stripes are each structurally separated at least at one part thereof.

13. The semiconductor device according to claim 12,
wherein said separated second pillar region or regions are each structurally separated at not less than two parts thereof in said terminal portion extended on one side.

14. The semiconductor device according to claim 11,
wherein said respective first pillar regions in said device portion and in said terminal portion are so formed as to be the same in impurity concentration, and
said respective second pillar regions in said device portion and in said terminal portion are so formed as to be the same in impurity concentration.

* * * * *